(12) United States Patent
Embar et al.

(10) Patent No.: US 10,506,704 B1
(45) Date of Patent: *Dec. 10, 2019

(54) ELECTROMAGNETICALLY-SHIELDED MICROELECTRONIC ASSEMBLIES AND METHODS FOR THE FABRICATION THEREOF

(71) Applicant: NXP USA, INC., Austin, TX (US)

(72) Inventors: Ramanujam Srinidhi Embar, Gilbert, AZ (US); Vikas Shilimkar, Chandler, AZ (US); Lakshminarayan Viswanathan, Phoenix, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/131,964

(22) Filed: Sep. 14, 2018

Related U.S. Application Data

(63) Continuation-in-part of application No. 16/107,089, filed on Aug. 21, 2018.

(51) Int. Cl.
- *H01L 23/66* (2006.01)
- *H05K 1/02* (2006.01)
- *H01L 23/552* (2006.01)

(52) U.S. Cl.
CPC ......... *H05K 1/0218* (2013.01); *H01L 23/552* (2013.01); *H01L 23/66* (2013.01)

(58) Field of Classification Search
CPC ... H01L 23/552; H01L 25/0657; H01L 23/66; H05K 9/0037; H05K 1/0218
See application file for complete search history.

(56) References Cited

U.S. PATENT DOCUMENTS

| | | |
|---|---|---|
| 6,747,879 B2 | 6/2004 | Baker |
| 8,030,763 B2 | 10/2011 | Romero et al. |
| 9,224,699 B2 | 12/2015 | Jang et al. |
| 9,312,817 B2 | 4/2016 | Aaen et al. |
| 9,349,693 B2 | 5/2016 | Lakshminarayan et al. |

(Continued)

OTHER PUBLICATIONS

Shielding Alloy 80 (MyMu 80). Alloy 49 (Comp 3) coild [online]. National Electronic Alloys. Retrieved from internet on Aug. 21, 2018: <URL: http://www.nealloys.com/pdf/Shielding_Alloys_Flyer_HYMU80.pdf>.

*Primary Examiner* — Kyoung Lee

(57) ABSTRACT

Microelectronic packages, modules, systems, and other assemblies containing enhanced electromagnetic (EM) shield structures are provided, as are methods for fabricating electromagnetically-shielded microelectronic assemblies. In an embodiment, the electromagnetically-shielded microelectronic assembly includes first and second signal paths, which carry different electrical signals during operation of the microelectronic assembly. An EM shield structure is positioned between the first and second signal paths. The EM shield structure includes, in turn, a magnetic shield portion adjacent (e.g., in contact with and/or directly or indirectly bonded to) an electrical shield portion. The magnetic shield portion has a first magnetic permeability and a first electrical conductivity, while the electrical shield portion has a second magnetic permeability less than the first magnetic permeability and having a second electrical conductivity greater than the first electrical conductivity.

20 Claims, 9 Drawing Sheets

(56) References Cited

U.S. PATENT DOCUMENTS

| | | |
|---|---|---|
| 9,401,342 B2 | 7/2016 | Meen Kuo et al. |
| 9,401,682 B2 | 7/2016 | Blednov et al. |
| 9,450,547 B2 | 9/2016 | Szymanowski et al. |
| 9,589,927 B2 | 3/2017 | Szymanowski et al. |
| 2006/0217792 A1* | 9/2006 | Hussein .............. A61N 1/16 607/122 |
| 2015/0070236 A1 | 3/2015 | Walters et al. |

* cited by examiner

ELECTROMAGNETICALLY-SHIELDED MICROELECTRONIC ASSEMBLIES AND METHODS FOR THE FABRICATION THEREOF

CROSS-REFERENCE TO RELATED APPLICATION

This application is a continuation-in-part of U.S. application Ser. No. 16/107,089, filed with the United States Patent and Trademark Office (USPTO) on Aug. 21, 2018, the contents of which are incorporated by reference.

TECHNICAL FIELD

Embodiments of the present invention relate generally to microelectronics and, more particularly, to microelectronic assemblies containing enhanced electromagnetic shield structures, as well to methods for fabricating electromagnetically-shielded microelectronic assemblies.

Abbreviations

The following abbreviations appear throughout this document:
Cu—copper;
EM—electromagnetic or electromagnetically;
Fe—iron;
GaN—gallium nitride;
MIMO—multiple input, multiple output (antenna structure);
PA—power amplification;
RF—radio frequency; and
$\mu_r$—relative (magnetic) permeability.

BACKGROUND

EM cross-coupling (more informally, "cross-talk") can occur between separate signal paths in microelectronic assemblies including microelectronic packages, modules, and systems. EM cross-coupling may be particularly problematic in the context of small-scale, high power RF applications. Consider, for example, an RF PA assembly containing high gain transistor die integrated into a package or module having a relatively compact form factor. By common design, the RF PA assembly may include with two or more transistor die attached to a base flange in a side-by-side relationship. Bondwire arrays may electrically interconnect the transistor die with other circuit elements, such as the PA terminals, integrated passive capacitors, or other devices contained in the RF PA assembly. Due to the close proximity of the transistor die and their corresponding bondwire arrays, EM cross-coupling may occur and, if sufficiently severe, may limit the performance of the microelectronic assembly; e.g., EM cross-coupling may displace the impedances presented to the transistor die, which, in turn, may detract from RF performance in terms of linearity, efficiency, peak power, or gain.

There thus exists an ongoing demand for the provision of microelectronic assemblies (e.g., packages, modules, and systems) less susceptible to EM cross-coupling, including when having a relatively compact form factor and operated at higher RF frequencies or power levels. Ideally, embodiments of such microelectronic assemblies would provide enhanced shielding of adjacent signal paths from both magnetic and electrical aspects of EM cross-coupling, while maintaining high level assembly performance and remaining cost effective to manufacture. Similarly, it is desirable to provide methods for manufacturing microelectronic assemblies having such favorable characteristics. Other desirable features and characteristics of embodiments of the present disclosure will become apparent from the subsequent Detailed Description and the appended Claims, taken in conjunction with the accompanying drawings and the foregoing Background.

BRIEF DESCRIPTION OF THE DRAWINGS

At least one example of the present invention will hereinafter be described in conjunction with the following figures, wherein like numerals denote like elements, and.

Figure 1:
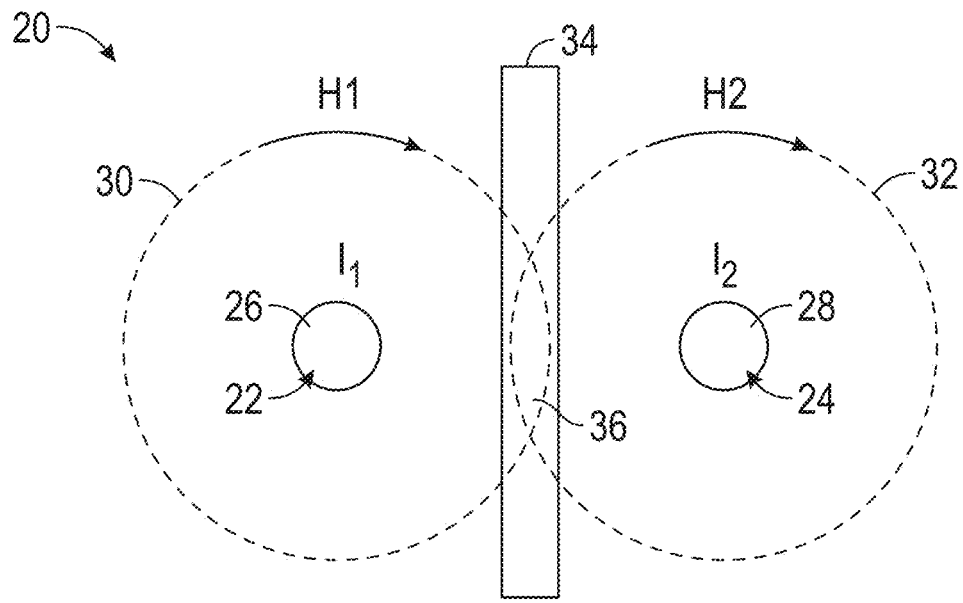
FIG. 1 is a diagram illustrating a core magnetic component of EM cross-coupling between adjacent signal paths in a microelectronic assembly (partially shown) containing an electrical shield structure, as depicted in accordance with the teachings of prior art.

For simplicity and clarity of illustration, descriptions and details of well-known features and techniques may be omitted to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following Detailed Description is merely exemplary in nature and is not intended to limit the invention or the application and uses of the invention. The term "exemplary," as appearing throughout this document, is synonymous with the term "example" and is utilized repeatedly below to emphasize that the following description provides only multiple non-limiting examples of the invention and should not be construed to restrict the scope of the invention, as set-out in the Claims, in any respect.

Definitions

The following definitions apply throughout this document. Those terms not expressly defined here or elsewhere in this document are assigned their ordinary meaning in the relevant technical field.

Electrically-conductive material—A material having an electrical resistivity less than 1 milli-Ohm millimeter at 20 degrees Celsius (° C.).

Electromagnetically-shielded microelectronic assembly—a microelectronic assembly (defined below) including at least one electromagnetic (EM) shield structure reducing magnetic and electrical cross-coupling between signal paths during operation of the assembly.

Interconnect Feature—An electrical conductor or a group of electrical conductors electrically connecting two or more points-of-contact, such as terminals or bond pads, contained in a microelectronic assembly.

Magnetically-permeable material—A material having a relative magnetic permeability ($\mu_r$) exceeding 1000.

Microelectronic assembly—a generic term utilized to broadly encompass microelectronic packages, modules, systems, and other articles of manufacture containing microelectronic circuitry.

Mu metal—any alloy composed principally of nickel (Ni) and Fe, by weight, and having a relative magnetic permeability exceeding 1000.

Relative magnetic permeability ($\mu_r$)—the ratio of magnetic permeability of a material or medium ($\mu$) over the magnetic permeability of free space ($\mu_0$).

Supermalloy—an alloy predominately composed of Ni, Fe, and molybdenum (Mo), by weight, and having a relative magnetic permeability exceeding 1000.

Overview

As discussed above, the performance of microelectronic packages, modules, systems, and other microelectronic assemblies can be limited by EM cross-coupling in certain instances. EM cross-coupling occurs due to interference between the EM fields generated when signal-containing electrical currents are directed through different or separate signal paths contained within an EM assembly. EM cross-coupling may be particularly problematic in certain applications, such as when the signal paths come into close proximity (e.g., due to a relative compact form factor of the assembly) and the assembly is operated at higher RF frequencies and/or power levels. Microelectronic assemblies containing high frequency RF circuitry, such as RF PA packages and modules, are often particularly susceptible to EM cross-coupling.

To date, industry efforts have focused on addressing the electrical component of EM cross-coupling, largely to the exclusion of addressing the magnetic component of EM cross-coupling. Accordingly, conventional electrical shield structures often assume the form of monolithic or single-layer walls composed of materials having relatively high electrical conductivities and low magnetic permeabilities, such as Cu. While potentially reducing electrical cross-coupling, such conventional electrical shield structures have little impact on the magnetic component of EM cross-coupling and, thus, provide an incomplete solution to the wholesale reduction or prevention of EM cross-coupling. Concurrently, conventional electrical shield structures may detract from other aspects of microelectronic assembly performance. For example, the provision of such electrical shield structures often entails the insertion of a relatively large body of electrically conductive material within the induced EM fields, which may result in eddy current losses, hysteresis effects, exacerbation of RF mismatch (when applicable), and other issues.

Further emphasizing the concept outlined above, FIG. 1 diagrammatically illustrates a limited portion of a conventional electrically-shielded microelectronic assembly 20. The depicted portion of microelectronic assembly 20 includes two signal paths 22, 24, which project into and out of the plane of the page. Signal paths 22, 24 are formed in part by (and, therefore, extend through) interconnects or bondwires 26, 28, respectively, as shown in cross-section in FIG. 1. Bondwires 26, 28 extend alongside one another in relatively close proximity for some distance. When signal-carrying currents ($I_1$, $I_2$) are directed along signal paths 22, 24 and, thus, conducted through bondwires 26, 28, corresponding magnetic fields are generated around bondwires 26, 28 in vectors normal to the electrical currents. The respective cores of the magnetic fields are labeled in FIG. 1 as "$H_1$" and "$H_2$," while the outer boundaries of the core magnetic fields are represented by dashed circles 30, 32. It will be appreciated that the induced magnetic fields may extend well-beyond dashed circles 30, 32 such that the magnetic field induced by passing current through bondwire 26 may impinge upon adjacent bondwire 28 and the magnetic field induced by passing current through bondwire 28 may impinge upon adjacent bondwire 26, potentially resulting in EM interference or cross-coupling as described below.

Signal paths 22, 24 carry separate or distinct electrical signals during operation of microelectronic assembly 20. The signals carried by signal paths 22, 24 may be digital signals, analog signals, or a combination thereof. Regardless of the signal type or types at issue, EM cross-coupling can potentially occur between signal paths 22, 24 due to the relative close proximity of bondwires 26, 28, depending upon the operational parameters of assembly 20; e.g., as noted above, EM cross-coupling may be particularly problematic in high frequency (e.g., RF) applications. In accordance with conventional approaches directed toward reducing the electrical aspects of EM cross-coupling, an intervening electrical shield structure 34 (hereafter, "electrical shield 34") may be positioned between bondwires 26, 28. When provided, electrical shield 34 may assume the form of a monolithic or single-layer wall, which is composed of a material (e.g., Cu) having a relatively high electrical conductivity and a relatively low magnetic permeability. While potentially reducing electrical cross-coupling between signal paths 22, 24, electrical shield 34 does little to reduce magnetic cross-coupling between the core magnetic fields ($H_1$, $H_2$). Instead, due to the low magnetic permeability of electrical shield 34, the core magnetic fields ($H_1$, $H_2$) may freely pass through the body of shield 34 and comingle or overlap in interference zone 36, as illustrated. When one (or both) of the core magnetic fields ($H_1$, $H_2$) induced by passing current through a first of signal paths 22, 24 becomes sufficiently wide or expansive to impinge upon the other of signal paths 22, 24, this impingement may alter the signal characteristics resulting in EM cross-coupling. Stated differently, the EM field induced by passing an electrical signal through one of signal paths 22, 24 may cause EM interference due direct to impingement of that EM field overlapping on fields caused by passing another electrical signal through the other of signal paths 22, 24, and vice versa. Excessive magnetic cross-coupling and, more broadly, EM cross-coupling may consequently occur thereby limiting the performance of assembly 20 in the previously-described manner.

Figure 2:
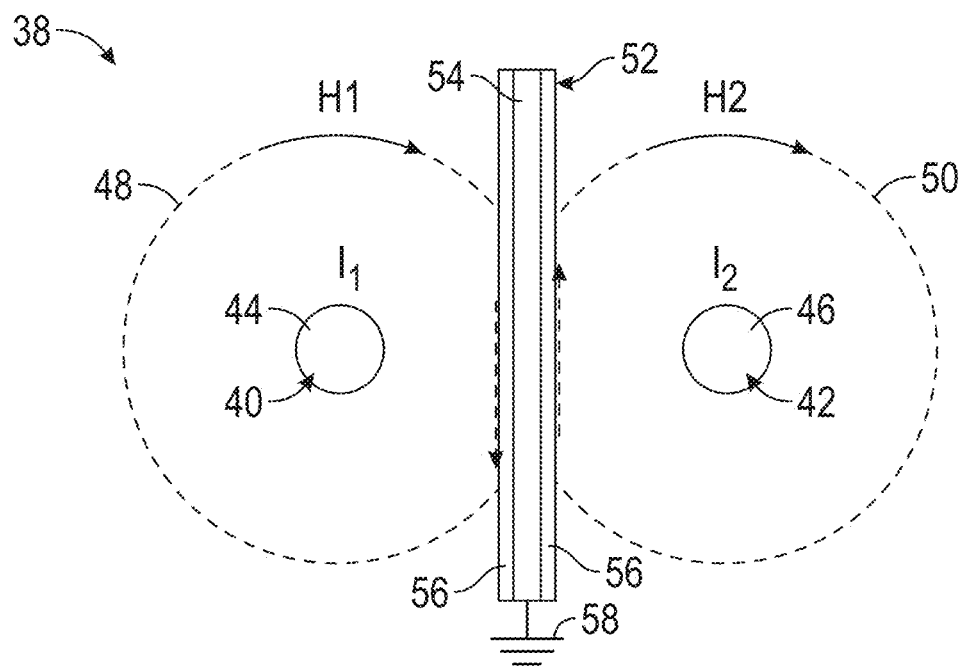
FIG. 2 is a diagram of a microelectronic assembly (partially shown) containing an enhanced EM shield structure, which minimizes EM cross-coupling between separate or distinct signal paths, as depicted in accordance with an exemplary embodiment of the present disclosure.

Turning to FIG. 2, a diagram of a limited portion of an EM-shielded microelectronic assembly 38 is illustrated in accordance with an exemplary embodiment of the present disclosure. In a general sense, EM-shielded microelectronic assembly 38 is similar to electrically-shielded microelectronic assembly 20 shown in FIG. 1. Once again, EM-shielded microelectronic assembly 38 includes two signal paths 40, 42, which carry different or distinct electrical signals during operation of assembly 38. Signal paths 40, 42 extend through interconnect features 44, 46, which project into and out of the page. As shown in cross-section in FIG. 2, interconnect features 44, 46 can be bondwires, metal (e.g., Cu) traces, or any other type of electrically-conductive elements. Interconnect features 44, 46 extend alongside one another in relatively close proximity for some distance. Magnetic fields are generated when signal-carrying currents ($I_1$, $I_2$) are directed through interconnect features 44, 46 and along signal paths 40, 42. As was previously the case, the outer boundaries of portions of magnetic fields ($H_1$, $H_2$) are represented in FIG. 2 by dashed circles 48, 50; again noting that only limited portions of the induced magnetic fields ($H_1$, $H_2$) are shown in FIG. 2 for clarity.

With continued reference to EM-shield microelectronic assembly 38 (FIG. 2), and in contrast to electrically-shielded microelectronic assembly 20 (FIG. 1), an intervening EM shield structure 52 is positioned between interconnect features 44, 46 and, therefore, between signal paths 40, 42. Due to the properties of EM shield structure 52, the core magnetic fields ($H_1$, $H_2$) generated during operation of assembly 38 do not extend significantly beyond EM shield structure 52 to impinge upon interconnect feature 44 and/or interconnect feature 46 located on the opposing side of shield structure 52 (or only do so to a greatly limited degree). EM shield structure 52 is at least partially composed of a magnetically-permeable material, which concentrates magnetic flux within layers 56 of structure 52 to limit the reach and overlap of the core magnetic fields ($H_1$, $H_2$). EM shield structure 52 can assume any form suitable for reducing magnetic cross-coupling and, more generally, EM cross-coupling between interconnect features 44, 46 in this manner. For example, in certain embodiments, EM shield structure 52 may assume the form of a monolithic wall or structure similar to electrical shield 34 (FIG. 1), but composed of a material having a relatively high magnetically-permeability. In more complex embodiments, and as depicted in FIG. 2, EM shield structure 52 includes at least one electrical shield portion or layer 54, which is bonded to (or otherwise bought into contact or proximity with) at least one magnetic shield portion or layer 56, as discussed more fully below.

Addressing first layer 54 of EM shield structure 52, electrical shield layer 54 is composed of a material having a higher electrical conductivity and lower magnetic permeability than does magnetic shield layer 56. In embodiments, electrical shield layer 54 is composed of a metallic material having an electrical conductivity less than 1 milli-Ohm millimeter at 20° C. Suitable materials include, but are not limited to, alloys containing one or more of the following as primary constituents by weight: Cu, Ni, aluminum (Al), silver (Ag), and gold (Au). As a still further possibility, electrical shield layer 54 may be composed of a material having moderate electrical conductivity and magnetic permeability properties. As indicated in FIG. 2 by symbol 58, electrical shield layer 54 may be electrically grounded to, for example, reduce eddy currents loses, hysteresis effects, and RF mismatch (when applicable). In other embodiments, layer 54 may not be electrically grounded.

Magnetic shield layer 56 may be composed of any magnetically-permeable material (or combination of magnetically-permeable materials) having a magnetic permeability greater than electrical shield layer 54 and an electrical conductivity less than layer 54. As appearing herein, a particular material (e.g., the material from which magnetic shield layer 56 is formed in the example of FIG. 2) is considered to have a magnetically permeability greater than another material (e.g., the material from which electrical shield layer 54 is formed in the example of FIG. 2) when the relative magnetic permeability ($\mu_r$) of the particular material exceeds the relative magnetic permeability ($\mu_r$) of the other material by at least 1%. Similarly, a particular material (e.g., the material from which magnetic shield layer 56 is formed) is considered to have an electrical conductivity less than another material (e.g., the material from which electrical shield layer 54 is formed) when the particular material has an electrical resistivity that is at least 1% greater than electrical resistivity of the other material at 20° C. The foregoing definitions apply throughout this document. Further, it will often be the case that a relatively large disparity will exist between the respective magnetically permeabilities and electrical conductivities of the magnetic shield layer(s) and electrical shield layer(s) included in a given EM shield structure. Accordingly, in embodiments, the magnetic permeability of magnetic shield layer 56 will be at least 50% greater and, preferably, at least twice the magnetic permeability of electrical shield layer 54. Additionally or alternatively, the electrical conductivity of electrical shield layer 54 may be at least 50% greater, if not at least twice the electrical conductivity of magnetic shield layer 56 in implementations. In still other embodiments, the respective magnetically permeabilities and electrical conductivities of layers 54, 56 may vary by a greater or lesser amount.

With continued reference to FIG. 2, in certain embodiments, each magnetic shield layer 56 may be composed of one or more materials having a relative magnetic permeability ($\mu_r$) exceeding 1000 and possibly exceeding 10,000.

Suitable materials include, but are not limited to, metallic materials including Mu metals, Fe-based alloys (e.g., permalloy), ferrites, electrical steels, amorphous metal alloys, and other alloys having relatively high magnetic permeabilities. Composite materials containing magnetically-permeable particles, fibers, or the like can also be utilized in embodiments. For example, in certain implementations, magnetic shield layer 56 can be produced from a molded material (e.g., an injection molded polymer) containing particles composed of ferrite, Fe, Mu metal, or another magnetically-permeable material. Due to the relatively high magnetic permeability of magnetic shield layer 56, magnetic flux is concentrated within and is principally directed through layer 56, rather than passing freely through structure 52, to prevent the impingement of the core magnetic fields ($H_1$, $H_2$) onto features 44, 46 on the opposite side of the structure 52. As a result, relatively little, if any magnetic cross-coupling occurs during assembly operation. Thus, taken in combination, electrical shield layer 54 and magnetic shield layer 56 provide a comprehensive and highly effective safeguard against EM cross-coupling that may otherwise occur during operation of microelectronic assembly 38.

The teachings of FIG. 2 are usefully applied to EM shield structures on a package level, a module level, a system level, or other global level. Further, EM shield structure 52 shown FIG. 2 and the other EM shield structures disclosed herein, can be positioned between any current-conducting components or circuit elements through which separate or distinct (e.g., electrically-parallel) signal paths extend. A non-exhaustive list of such components includes active microelectronic devices (e.g., semiconductor and Microelectromechanical systems (MEMS) die), passive microelectronic devices (e.g., Surface Mount Devices (SMDs) and integrated passive devices), and interconnect features, such as interconnect lines (e.g., metal traces), wirebonds, and other such features utilized for electrical interconnection purposes. Several exemplary implementations of EM shield structures, which are positioned between bondwire arrays, are discussed set-forth in conjunction with FIGS. 4-11. First, however, an exemplary description is provided in conjunction with FIG. 3 of a microelectronic package into which one or more EM shield structures may be incorporated. The following notwithstanding, further embodiments of the EM shield structures can be incorporated into various other types of microelectronic assemblies including modules and systems, such as a massive MIMO module of the type further discussed below in conjunction with FIG. 12.

Figure 3:
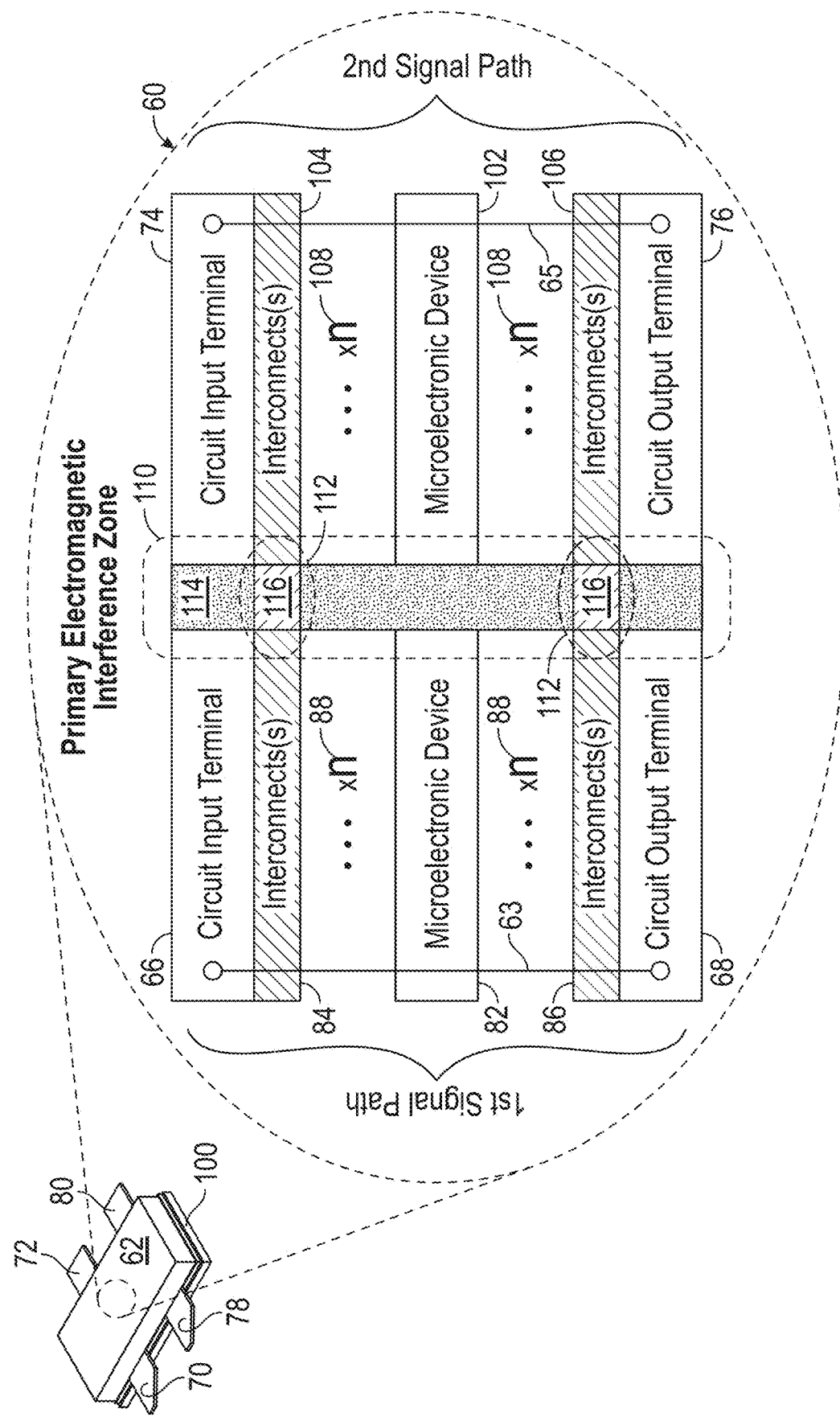
FIG. 3 is a schematic of a microelectronic assembly (here, an RF PA package) containing one or more EM shield structures, as illustrated in accordance with a generalized embodiment of the present disclosure.

Advancing to FIG. 3, an electromagnetically-shielded circuit structure 60 (hereafter, "EM-shielded circuitry 60") is schematically depicted in accordance with an exemplary embodiment of the present disclosure. EM-shielded circuitry 60 is usefully integrated into a microelectronic assembly, such as a module or a microelectronic package 62 shown in the upper left of FIG. 3. In this particular example, microelectronic package 62 assumes the form of a leaded air cavity package; however, in alternative implementations, microelectronic package 62 may assume various other forms, such as that of a no-lead package or a molded package having a different lead type. The functionalities provided by EM-shielded circuitry 60 will vary widely among embodiments, as appropriate to satisfy a particular application or usage; however, by way of non-limiting example, circuitry 60 may provide RF PA functionalities in one possible implementation, while microelectronic package 62 may assume the form of an N-way PA implemented utilizing one or more (i.e., N) high gain transistor die, such as laterally-diffused metal-oxide-semiconductor (LDMOS), GaN, or gallium arsenide (GaAs) transistors, arranged in N parallel amplification paths.

EM-shielded circuitry 60 includes a first signal path 63 and a second signal path 65, which extend at least partly through circuitry 60 and carry electrical signals in parallel during circuit operation. Signal paths 63, 65 may extend through the entirety of microelectronic package 62 and, therefore, between the input/output (I/O) terminals (leads or pins) of microelectronic package 62. Specifically, signal path 63 may extend from an input terminal 66 to an output terminal 68 of circuit 60, which may correspond with an input lead 70 and output lead 72 of microelectronic package 62, respectively, as further labeled in the upper left corner of FIG. 3. Similarly, signal path 65 may extend from an input terminal 74 to an output terminal 76 of circuitry 60, which may correspond with an input lead 78 and output lead 80 of microelectronic package 62, respectively. In further embodiments, circuitry 60 may include a different number of signal paths, input terminals, and output terminals, or may otherwise vary with respect to the illustrated example.

As generically shown in FIG. 3, at least one microelectronic device 82 is positioned in signal path 63 and electrically interconnected between terminals 66, 68 of circuitry 60. Microelectronic device 82 can be, for example, a semiconductor die carrying integrated circuitry, such as RF circuitry; e.g., an RF power transistor with a control (input) terminal electrically connected to input terminal 66, and a current-carrying (output) terminal electrically connected to output terminal 68 Selected terminals, such as bond pads, of microelectronic device 82 may be electrically coupled to circuit input terminal 66 by one or more interconnect features 84. Interconnect features 84 may assume the form of, for example, patterned metal (e.g., Cu, Al, or Au) traces, three-dimensionally (e.g., inkjet) printed traces, bondwires, conductive vias, or various other electrically-conductive structures. Similarly, other terminals of microelectronic device 82 are electrically coupled to circuit output terminal 68 by one or more interconnect features 86, which again may be bondwires, metal traces, or other electrical conductors utilized for interconnection purposes.

Microelectronic device 82 may be directly interconnected to either or both of terminals 66, 68 in embodiments. Alternatively, and as indicated in FIG. 3 by symbols 88, any number of intervening microelectronic devices and interconnect features may be further provided in signal path 63 between terminals 66, 68. For example, in one realization of circuitry 60, microelectronic device 82 assumes the form of an active semiconductor die, such as an RF semiconductor power transistor die, which is directly connected with terminals 66, 68 by interconnect features 84, 86 in the form of bondwires or bondwire arrays. In such embodiments, the RF semiconductor die may further be electrically coupled to electrical ground through an electrically-conductive substrate or base flange 100 also contained in package 62, as further indicated in the upper left corner of FIG. 3. Alternatively, in other implementations, microelectronic device 82 may not be directly connected to terminals 66, 68, but rather electrically coupled to one or more passive devices, such as SMD or integrated passive devices (e.g., capacitor structures), further contained within or integrated into microelectronic package 62. Any such passive devices may be electrically coupled to terminals 66, 68, in turn, to complete the desired circuit structure. Numerous other circuit architectures are also possible, with circuitry 60 suitably containing any number and type of active devices (e.g., semiconductor die and MEMS die), passive devices (e.g., integrated passive devices and SMDs), and other such devices (e.g., RF antenna or shield structures) electrically interconnected between terminals 66, 68 to form signal path 63, as desired.

In the illustrated example of FIG. 3, the circuit elements defining second signal path 65 of circuitry 60 are similar or identical to those defining first signal path 63. Thus, as was previously the case, at least one microelectronic device 102 (e.g., a semiconductor die) is electrically coupled, whether directly or indirectly, to circuit input terminal 74 via a first interconnect feature 104, such as a first bondwire array. Microelectronic device 102 is further electrically coupled, directly or indirectly, to circuit output terminal 76 via a second interconnect feature 106, such as a second bondwire array. Once again, and as schematically indicated by symbols 108, any number and type of additional microelectronic devices and interconnect features can likewise be provided between microelectronic device 102 and terminals 74, 76 to form the desired circuit structure. For example, in embodiments in which microelectronic package 62 assumes the form of a dual path RF power amplifier, microelectronic devices 82, 102 may be high power (e.g., LDMOS or GaN) transistor die, and one or more sets of integrated capacitors may potentially be electrically interconnected between devices 82, 102 and corresponding circuit terminals 66, 68, 74, 76. In such embodiments, one of signal paths 63, 65 may be formed by the peaking transistor elements of a Doherty PA or other multi-path amplifier, while the other of signals paths 63, 65 is formed by the carrier transistor elements of a Doherty PA or other multi-path amplifier. Again, numerous other circuit layouts are also possible in further implementations, with the schematic of FIG. 3 provided by way non-limiting example only.

Due to the relative close physical spacing of the electrically-conductive circuit elements defining circuit path 63 (namely, input terminal 66, interconnect feature 84, microelectronic device 82, interconnect feature 86, and output terminal 68) and the electrically-conductive circuit elements defining parallel circuit path 65 (namely, input terminal 74, interconnect feature 104, microelectronic device 102, interconnect feature 106, and output terminal 76), EM cross-coupling can occur during operation of circuitry 60. Depending upon its severity, EM cross-coupling can potentially detract from certain aspects of circuit performance and, more broadly, from the overall performance of microelectronic package 62. For example, EM cross-coupling and, particularly, the magnetic component of EM cross-coupling can displace the impedances presented to the transistor die (e.g., devices 82, 102), which may, in turn, limit RF performance (when applicable) in terms of linearity, efficiency, peak power, gain, or any combination thereof. EM cross-coupling may principally occur when induced EM fields extend across a primary EM interference zone 110 between parallel circuit paths 63, 65. Specifically, it has been determined that undesired EM cross-coupling may be problematic when crossing localized regions 112 to impinge upon an opposing one of interconnect features 84, 104 and/or an opposing one of interconnect features 86, 106 in at least some implementations of circuitry 60. Undesired EM cross-coupling may result negatively impacting the performance of circuitry 60; e.g., in circuit terms, for example, a mutual inductance or mutual capacitance may develop and alter the currents and voltages of the signals conducted through circuit paths 63, 65.

To decrease EM cross-coupling during operation of circuitry 60 and package 62, a single, elongated EM shield structure 114 may be positioned in primary EM interference zone 110 between the circuit elements defining signal paths 63, 65. In various embodiments, EM shield structure 114 may assume the form of a wall, fin, or freestanding strip composed of a magnetically-permeable material, such as Mu metal, permalloy, or ferrite; potentially bonded to or otherwise joined to (or positioned in an abutting relationship or close proximity with) another strip or wall of an electrically-conductive material of the type previously discussed. For example, in certain implementations, EM shield structure 114 may have a construction similar or analogous to that of EM shield structure 52 shown in FIG. 2. In embodiments, EM shield structure 114 may extend the entire length (and, perhaps, slightly beyond) primary EM interference zone 110. In other embodiments, multiple, smaller EM shield structures 116 may be disposed in a more targeted manner in localized regions (including but not limited to regions 112) between adjacent sets of interconnect features; e.g., a first structure 116 may be positioned between features 84, 104 and a second structure 116 may be positioned between features 86, 106. As a still further possibility, a combination of these approaches can be employed such that a relatively lengthy EM shield structure may extend the length of zone 110, while the magnetic isolation properties of the shield structure may be enhanced in localized regions 112 by, for example, providing an increased volume of magnetically-permeable material in these regions. Several exemplary implementations of the EM shield structures will now be discussed in conjunction with FIGS. 4-11. Notably, the below-described shield structures can be utilized in various combinations in embodiments of EM-shielded microelectronic package 62 and the other EM-shielded microelectronic assemblies described herein, including the massive MIMO module discussed below in connection with FIG. 12. Considering this, the exemplary embodiments set-forth below are not mutually exclusive unless otherwise stated.

Figure 4:
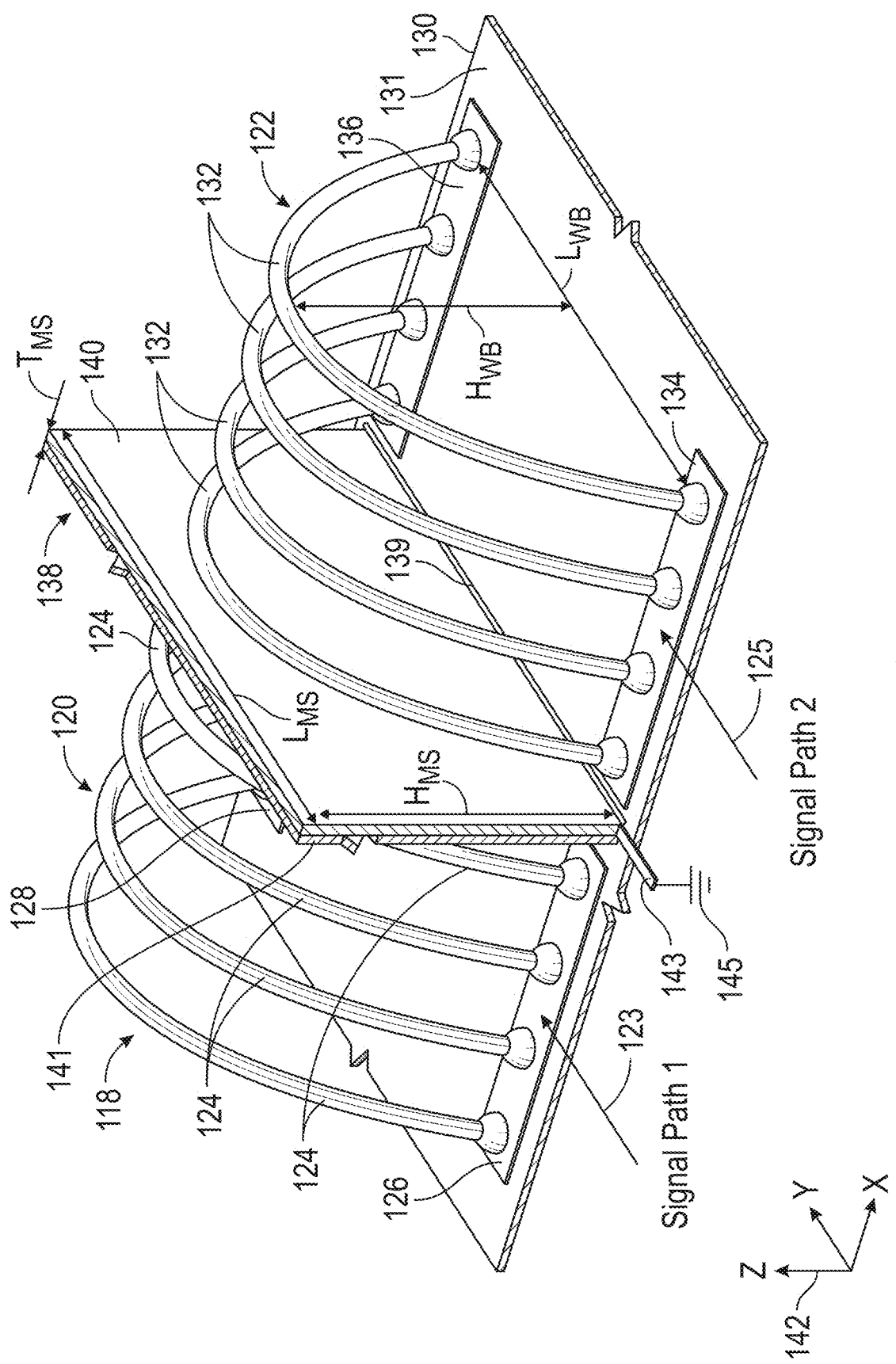
FIG. 4 is an isometric view of two adjacent interconnect features (here, neighboring bondwire arrays) separated by an intervening EM shield structure, which includes continuous, non-patterned electrical and magnetic shield layers, as illustrated in accordance with an exemplary implementation of the present disclosure.

Initially addressing the exemplary implementation shown in FIG. 4, a limited portion of an EM-shielded microelectronic assembly 118 is depicted in accordance with an exemplary embodiment of the present disclosure. Microelectronic assembly 118 includes at least two separate signal paths 123, 125, which extend in parallel (in an electrical sense and, perhaps, in a spatial or geometric sense) through the illustrated portion of assembly 118. Additionally, microelectronic assembly 118 includes first and second interconnect features 120, 122 through which signal paths 123, 125 extend. In this example, interconnect features 120, 122 are illustrated as bondwire arrays and will consequently be referred to hereafter as "bondwire arrays 120, 122," respectively. In further embodiments, bondwires arrays 120, 122 may each be replaced by a single bondwire or a different type of electrical conductor, such one or more metal traces. In embodiments, microelectronic assembly 118 may correspond to microelectronic package 62 shown in FIG. 3, in which case signal paths 123, 125 may correspond to signal paths 63, 65, while interconnect features 120, 122 correspond to interconnect features 84, 104 or interconnect features 86, 106, respectively.

Bondwire array 120 includes a plurality of bondwires 124, which are arranged in a grouping or row spaced along a lateral axis in FIG. 4 (corresponding to the X-axis identified by coordinate legend 142). Bondwires 124 each extend between two points of contacts, here bond pads 126, 128, provided on an upper principal surface or frontside 131 of an assembly substrate 130. Similarly, bondwire array 122 includes a plurality of bondwires 132, which are arranged in a row and extend between bond pads 134, 136 further provided on frontside 131 of substrate 130. Bond pads 126, 128, 134, 136 and substrate 130 are provided by way of example only, with the understanding that bondwire arrays 120, 122 can extend between and electrically connect various different types of terminals or points-of-contact. For example, in alternative embodiments, bondwire arrays 120, 122 may each extend from bond pads provided on semiconductor die or other microelectronic devices (e.g., devices 82, 102 shown in FIG. 3) to a bond pad shelf or other dedicated point-of-contact within a microelectronic package, module, or system. Assembly substrate 130 can be a flange, a printed circuit or wiring board, or any other supportive body, which may or may not contain electrical routing features. Again only a limited region of substrate 130 is depicted in FIG. 4, noting that EM-shielded microelectronic assembly 118 will further include various other circuit elements and interconnect features not shown for illustrative clarity.

A wall-like EM shield structure 138 is disposed between bondwire arrays 120, 122, with arrays 120, 122 located on opposing sides of structure 138. EM shield structure 138 physically separates or partitions arrays 120, 122, as taken along a lateral axis parallel to substrate frontside 131 (corresponding to the X-axis of coordinate legend 142). In the illustrated example, EM shield structure 138 includes at least two distinct portions or regions: (i) an electrical shield portion or layer 140, and (ii) a magnetic shield portion or layer 141. Electrical shield layer 140 and magnetic shield layer 141 may assume the form of continuous or non-patterned layers, which are bonded or otherwise joined to form a bilayer wall. In other embodiments, electrical and magnetic shield layers 140, 141 may not be directly bonded, but rather positioned adjacent one another as taken along the lateral axis and, perhaps, brought into physical contact; e.g., shield layers 140, 141 may be pressed or clamped together in some fashion.

Magnetic shield layer 140 may be composed of a magnetically-permeable material, such as a Mu metal, an Fe-based alloy (e.g., a permalloy), an electrical steel, or the other materials described herein. Alternatively, magnetic shield layer 141 can be composed of a composite material containing magnetically-permeable (e.g., Fe or ferrite) particles or other filler; or any other material having a relative magnetic permeability ($\mu_r$) exceeding 1000 and, more preferably, exceeding 10,000. In other embodiments, layer 141 may be composed of a material having a magnetic permeability equal to or greater than 80,000 Henries per meter. Comparatively, electrical shield layer 140 can be composed of any material having an electrical conductivity greater than magnetic shield layer 141 and a magnetic permeability less than layer 140. Further, in embodiments, electrical shield layer 140 may be composed of a material having an electrical conductivity at least 50% greater, if not at least twice the electrical conductivity of the material from which magnetic shield layer 141 is composed; while magnetic shield layer 141 may be composed of a material having a magnetic permeability at least 50% greater, if not at least twice the magnetic permeability of the material from which electrical shield layer 140 is composed. A non-exhaustive list of suitable materials for forming all or a portion of electrical shield layer 140 include metals and alloys containing Cu, Ni, Al, Au, Ag, or any combination thereof as primary constituents, by weight. As indicated in FIG. 4 by symbol 145, electrical shield layer 140 may be coupled to electrical ground by, for example, a grounded conductor 143, such as a metal trace, a plated via, or ground plane. Grounding of electrical shield layer 140 may help reduce any eddy current loses and provide other performance benefits during operation of assembly 118, as discussed below. In other embodiments, electrical shield layer 140 may not be grounded.

The dimensions, composition, and construction of EM shield structure 138 will vary among embodiments and can be tailored to provide a desired level of magnetic shielding between bondwire arrays 120, 122 and, more generally, different signal paths 123, 125. In at least some embodiments, EM shield structure 138 may extend along the Y-axis of legend 142 for a distance well-beyond that shown in FIG. 4 to provide magnetic isolation between other adjacent interconnect features contained in signal paths 123, 125. For example, EM shield structure 138 can potentially be dimensioned to extend the entirety or the substantial entirety of primary magnetic interference zone 110 in FIG. 3. Alternatively, EM shield structure 138 may not extend the entirety of magnetic interface zone 110; and EM shield structure 138 may instead be imparted with reduced dimensions, with multiple instances of structure 138 incorporated into EM-shielded circuitry 60. Regardless, EM shield structure 138 may be joined to substrate 130 in various manners, with structure 138 oriented such that the opposing principal surfaces of structure 138 form essentially right angles with substrate frontside 131. For example, EM shield structure 138 may be separately fabricated from substrate 130 and brazed or bonded thereto utilize a die attach material, an epoxy, a sintered metallic material, or other adhesive. Moreover, in certain embodiments, a lower portion or edge of structure 138 may be matingly received within a shallow trench 139 formed in frontside 131 of substrate 130 for added support.

With continued reference to FIG. 4, EM shield structure 138 has a peak height $H_{MS}$, as measured along an axis orthogonal to frontside 131 of substrate 130 and parallel to the Z-axis of coordinate legend 142; a maximum length $L_{MS}$, as measured along an axis parallel to substrate 130 and to the Y-axis of coordinate legend 142; and an average thickness $T_{MS}$, as measured along an axis parallel to substrate 130 and to the X-axis of legend 142. As indicated above, $H_{MS}$, $L_{MS}$, and $T_{MS}$ will vary among embodiments and need not be held constant across the entirety of EM shield structure 138. Generally, however, $H_{MS}$ will often be equal to or greater than the peak height of bondwire arrays 120, 122, as identified in FIG. 4 by double-headed arrow "$H_{WB}$" and again measured along an axis orthogonal to substrate frontside 131. Similarly, $L_{MS}$ will often be equal to or greater than the maximum length of one or both of bondwire arrays 120, 122, as identified in FIG. 4 by double-headed arrow "$L_{WB}$" and measured along an axis parallel to the Y-axis of coordinate legend 142. Dimensioning EM shield structure 138 in this manner may better accommodate the reach of the magnetic fields induced when signal-carrying electrical currents are passed through arrays 120, 122, to maximize the effectiveness of structure 138.

The thickness of EM shield structure 138 may be constant or, instead, may vary to provide enhanced magnetic shielding in regions of greater flux line concentration. In one embodiment, EM shield structure 138 has an average thickness ($T_{MS}$) ranging from 1 to 100 millimeters (mm) and, more preferably, from 5 to 50 mm. In such embodiments or in other embodiments, magnetic shield layer 141 may make-up or comprise at least half the thickness of EM shield structure 138 such that the thickness of layer 141 is equal to or greater than the thickness of electrical shield layer 140 and, perhaps, at least twice the thickness of layer 140. As a more specific example, and without loss of generality, magnetic shield layer 141 may make-up or comprise about 50% to about 90% of the total thickness of EM shield structure 138 (again, as measured along an axis orthogonal to a principal face of shield structure 138), with electrical shield layer 140 making-up the remainder of the thickness of shield structure 138. In still other embodiments, $T_{MS}$ may be greater than or less than the aforementioned ranges and/or the relative thickness of layers 140, 141 may vary relative to the examples set-forth above.

Figure 5:
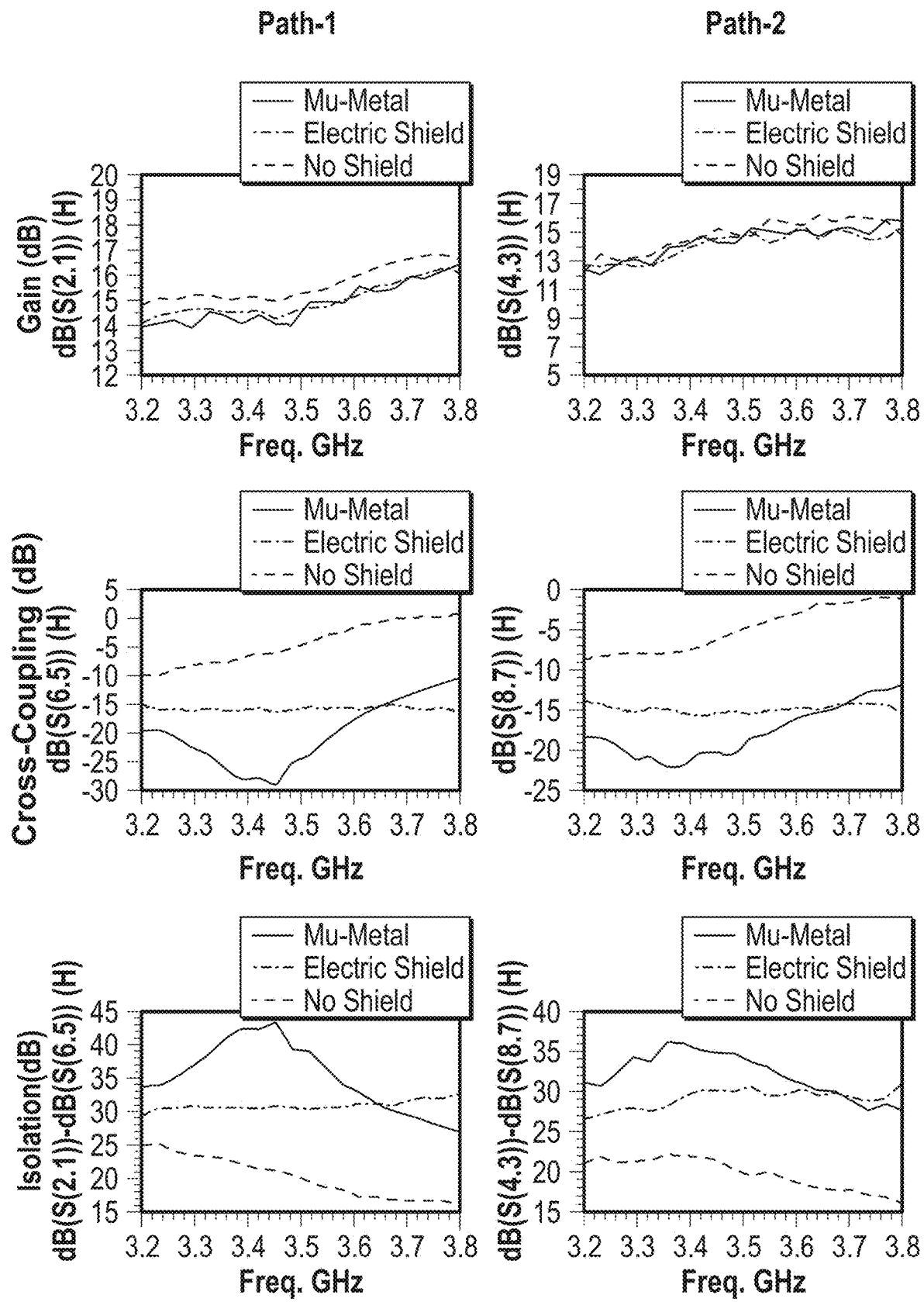
FIG. 5 graphically depicts simulated improvements in gain, cross-coupling, and isolation achieved by the EM-shielded microelectronic assembly shown in FIG. 4, as compared to similar microelectronic assemblies containing an electrical shield structure and lacking any shield structure.

FIG. 5 graphically depicts simulated improvements in gain, cross-coupling, and isolation achieved by EM-shielded microelectronic assembly 118. In this simulation, magnetic shield layer 141 of EM shield structure 138 (FIG. 4) is composed of a Mu metal and has a constant thickness of 10 mm, while electrical shield layer 140 is composed of a sheet of Cu and has an approximately equivalent thickness. Further, EM-shielded microelectronic assembly 118 is simulated as an RF circuit structure (e.g., a 2-way RF power amplifier) operable over a frequency range from 3.2 to 3.8 gigahertz. The performance of EM-shielded microelectronic assembly 118 (as represented by a first trace pattern in FIG. 5) is compared to a similar microelectronic assembly having an electrical (Cu) shield structure, but lacking a magnetically-permeable shield layer (represented by a second trace pattern) and a similar circuit lacking any shield structure (represented by a third trace pattern). As can be seen in the middle row of graphs presented in FIG. 5, magnetic cross-coupling between the two simulated signal paths is greatly reduced during assembly operation in the case of EM-shielded microelectronic assemblies 118 due to the provision of EM shield structure 138 (FIG. 4). Correspondingly, as indicated in the lower row of graphs, magnetic isolation between the different signal paths is significantly improved; e.g., the provision of EM shield structure 138 demonstrated isolation improvements over 10 decibels (dB) as compared to the microelectronic assembly containing an electrical (e.g., Cu) shield and over 20 dB as compared to the microelectronic assembly lacking any shield. Finally, as indicated in the upper row of graphs in FIG. 5, the inclusion of EM shield structure 138 (FIG. 4) within microelectronic assemblies 118 may provide minor, if not negligible detriments in gain.

As described above, EM shield structure 138 has a relatively simple, dual layer construction in the embodiment of FIG. 4. Advantageously, such a construction may lower the costs and complexity of manufacture when producing structure 138. EM shield structure 138 can be fabricated in various different manners. For example, in one approach, magnetic shield layer 141 may be cut (e.g., via laser cutting, water jetting, stamping, sawing, or the like) from a larger sheet of magnetically-permeable material, which is singulated into multiple shield structures. Examples such material are discussed above in conjunction with EM shield structure 52 shown in FIG. 2 and include Mu metals, Fe-based alloys (e.g., a permalloy), electrical steels, and various other alloys having relatively high magnetic permeabilities. Prior to or following singulation of the magnetically-permeable sheet, electrical shield layer 140 may be formed on magnetic shield layer 141 by, for example, plating or electrodepositing an electrically-conductive alloy on the magnetically-permeable sheet. Alternatively, electrical shield layer 140 may likewise be cut from a larger sheet or panel of electrically-conductive material and then bonded to magnetic shield layer 141 utilizing, for example, a die attach material, a sintered metallic material, a metal-filled epoxy, or the like. As a still further possibility, electrical shield layer 140 may initially be produced and then utilized as substrate onto which magnetic shield layer 141 is deposited; e.g., by plating, by sputter depositing, or other depositing a magnetically-permeable alloy onto selected surfaces of magnetic shield layer 141. In such embodiments, electric shield layer 140 may also be considered a "substrate layer" or "shield substrate." In yet further embodiments, layers 140, 141 may not be directly bonded, but rather placed in intimate contact or close proximity. While the relatively simply construction of EM shield structure 138 may reduce cost, other advantages may be gained by fabricating structure 138 to have a more complex construction. For example, in further embodiments, the EM shield structure may include one or more patterned or shaped layers of magnetically-permeable material and/or electrically-conductive material, as discussed below in conjunction with FIGS. 6-10.

Figure 6:
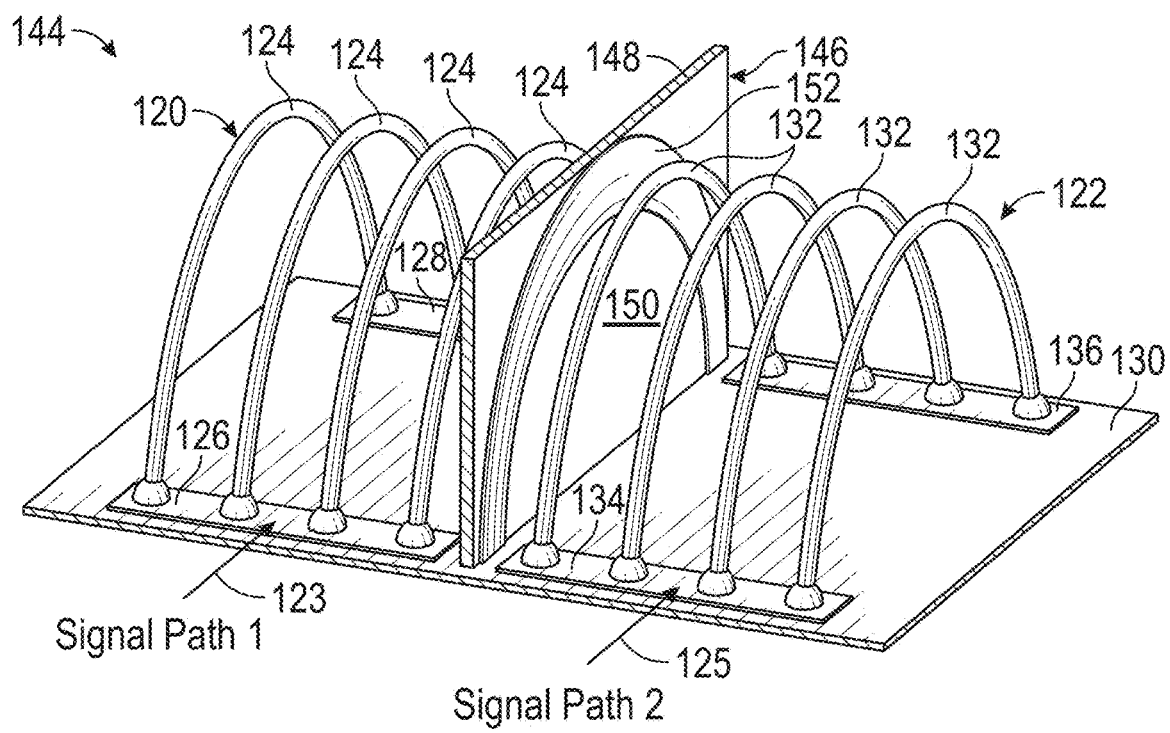
FIGS. 6 and 7 are isometric views of adjacent bondwire arrays separated by an intervening EM shield structure, which includes patterned magnetic shield layer (FIG. 6) and a patterned electrical shield layer (FIG. 7) bonded to opposing surfaces of a shield substrate, such as a core dielectric layer, as illustrated in accordance with a further exemplary implementation of the present disclosure.
Figure 7:
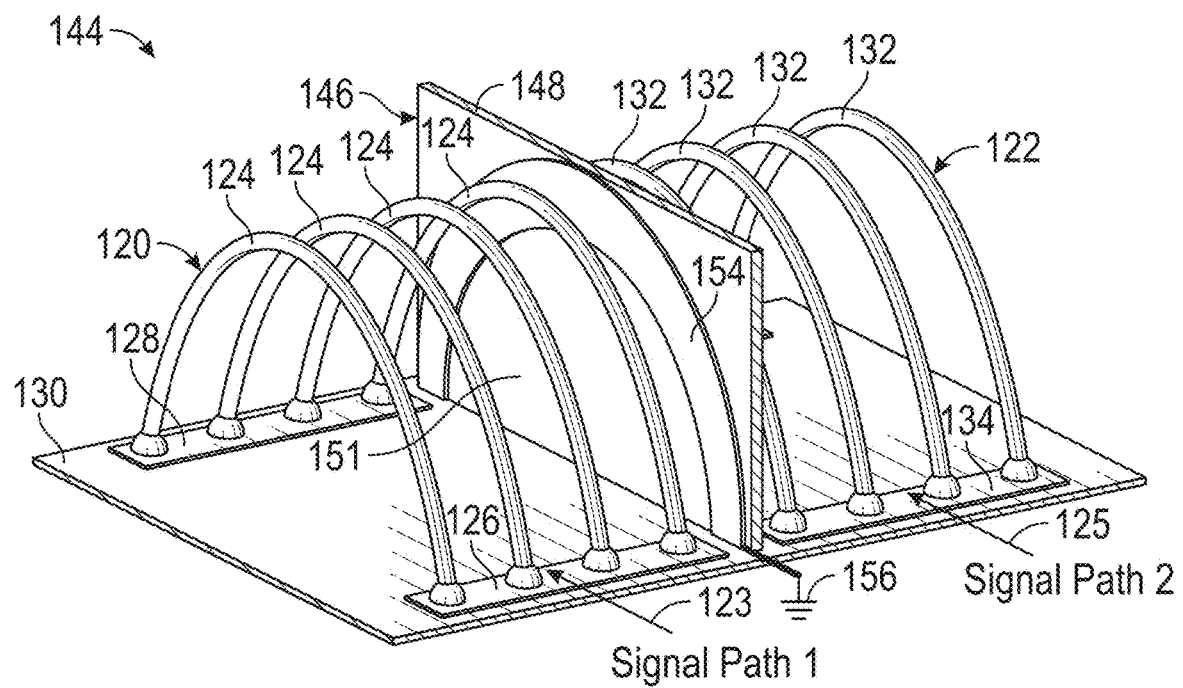

FIGS. 6 and 7 are isometric views of an EM-shielded microelectronic assembly 144 including an EM shield structure 146, as illustrated in accordance with a further exemplary embodiment of the present disclosure. EM-shielded microelectronic assembly 144 is similar to EM-shielded microelectronic assembly 118, with assemblies 118, 144 sharing several structural elements in common. Accordingly, the reference numerals previously introduced in conjunction with FIG. 4 have been carried-over to FIGS. 6 and 7, where appropriate, and the foregoing description of signal paths 123, 125, bondwire arrays 120, 122, and assembly substrate 130 applies equally. As previously the case, EM shield structure 146 has a generally rectangular, wall-like or plate-like form factor in the illustrated example; and extends upwardly from the frontside of assembly substrate 130 between bondwire arrays 120, 122. Stated differently, EM shield structure 146 forms a right angle with substrate 130 and physically partitions or separates bondwire arrays 120, 122, as taken along an axis orthogonal to either of the opposing principal surfaces of structure 146. Thus, once again, bondwire arrays 120, 122 are located on opposing sides of EM shield structure 146. In further embodiments, EM shield structure 146 may have a more complex shape, such as a curved planform geometry or planform geometry defined by multiple intersecting walls.

In contrast to EM shield structure 138 contained in microelectronic assembly 118 shown in FIG. 4, EM shield structure 146 of microelectronic assembly 144 has a more complex, multilayered construction. Specifically, in the example shown in FIGS. 6-7, EM shield structure 146 includes a dielectric substrate layer or shield substrate 148 having opposing principal surfaces 150, 151, which face bondwire arrays 122, 120, respectively. As shown most clearly in FIG. 6, a first patterned layer of magnetically-permeable material 152 (hereafter, "patterned magnetic shield layer 152") is formed on principal surface 150 of substrate layer 148. Similarly, and as indicated in FIG. 7, a patterned layer of an electrically-conductive material 154 (hereafter, "patterned electrical shield layer 154") may be formed on substrate surface 151 opposite patterned magnetic shield layer 152. Layers 152, 154 are thus positioned adjacent one another, although separated by substrate layer 148, and may also be referred to as indirectly bonded. EM shield structure 138 is thus similar or akin to a two-sided printed circuit board (PCB) or wiring board in the illustrated example. In further embodiments, shield structure 138 can include a greater number or lesser number of patterned or non-patterned (continuous) layers.

Substrate layer 148 can be composed of a metallic material, a dielectric material of the type commonly utilized in PCB production (e.g., polytetrafluoroethylene or a polyimide), a ceramic, or another material. Patterned magnetic shield layer 152 can be deposited onto principal surface 150 of substrate layer 148 in different manners, with the selected deposition process depending upon the composition of substrate layer 148, the composition of shield layer 152, the desired thickness of shield layer 152, and other such factors. For example, patterned magnetic shield layer 152 can be electroplated onto substrate surface 150 as a magnetically-permeable (e.g., Fe-rich) plating. In other embodiments, patterned magnetic shield layer 152 can be applied onto surface 150 of substrate layer 148 utilizing a film transfer process, as a B-stage epoxy, or via silkscreen application. In this latter regard, a wet-state material (e.g., a paste, paint, or slurry) may be prepared or otherwise obtained to include magnetically-permeable particles dispersed in a liquid carrier or solvent, such as water or a high molecular weight alcohol. The wet-state material may also contain other constituents, such as organic additives (e.g., an acrylic), added for strengthen purposes. After application of the wet-state material to substrate surface 150 utilizing a suitable process (e.g., a silkscreen process or another deposition process capable of depositing a flowable material in a desired pattern, such as fine needle dispense), the wet-state material may then be thermally processed (e.g., dried and possibly baked) to remove some or all of the organic fraction from the wet-state material, thereby producing patterned magnetic shield layer 152.

With continued reference to FIGS. 6-7, and as shown most clearly in FIG. 7, patterned electrical shield layer 154 can be formed on substrate surface 151 utilizing the various different deposition processes described above in conjunction with patterned magnetic shield layer 152. In other embodiments, patterned electrical shield layer 154 may be fabricated utilizing well-known metal deposition and lithography techniques, such as those commonly utilized to produce metal traces on circuit boards. Further, if desired, patterned electrical shield layer 154 may be electrically grounded by, for example, electrically coupling patterned electrical shield layer 154 to a grounded trace, conductive via, coin, or other electrically-grounded interconnect feature, as indicated in FIG. 7 by symbol 156. As noted above, grounding of layer 154 may help reduce eddy current loses and provide other performance benefits. The composition and thickness of patterned electrical shield layer 154 will vary among embodiments; however, in one embodiment, electrical shield layer 154 is at least principally composed of Cu, Al, or Au, by weight, and has a thickness between 0.01 and 10 mm. More generally, electrical shield layer 154 will typically be composed of material having a greater electrical conductivity, but a lower magnetic permeability than does magnetic shield layer 152 (FIG. 6). For example, in certain embodiments and in a manner akin to that previously described, electrical shield layer 154 may be composed of a material having an electrical conductivity at least 50% greater, if not at least twice the electrical conductivity of the material from which magnetic shield layer 152 is composed; while magnetic shield layer 152 may be composed of a material having a magnetic permeability at least 50% greater, if not at least twice the magnetic permeability of the material from which electrical shield layer 154 is composed.

Several benefits are realized by forming EM shield structure 146 to include patterned shield layers 150, 152 in the above-described manner, rather than by forming structure 146 to contain non-patterned, continuous layers. First, some level of cost reduction may be achieved via the reduced volume of shield layers 150, 152, particularly when more costly materials are utilized to produce one or both of shield layers 150, 152. Second, by minimizing the shielding material surface area, issues such as RF mismatch, reduced bondwire Q (potentially resulting in increased eddy current losses in the shield structure), and memory effects (hysteresis), can be significantly reduced, if not essentially avoided. These notwithstanding, one or both of layers 150, 152 may be provided as non-patterned layers or sheets in further embodiments. For example, in an alternative embodiment, electrical shield layer 154 may be formed as a continuous sheet or wall, while magnetic shield layer 152 may be directly bonded to layer 154 as a patterned layer similar or identical to that shown in FIG. 6.

Figure 8:
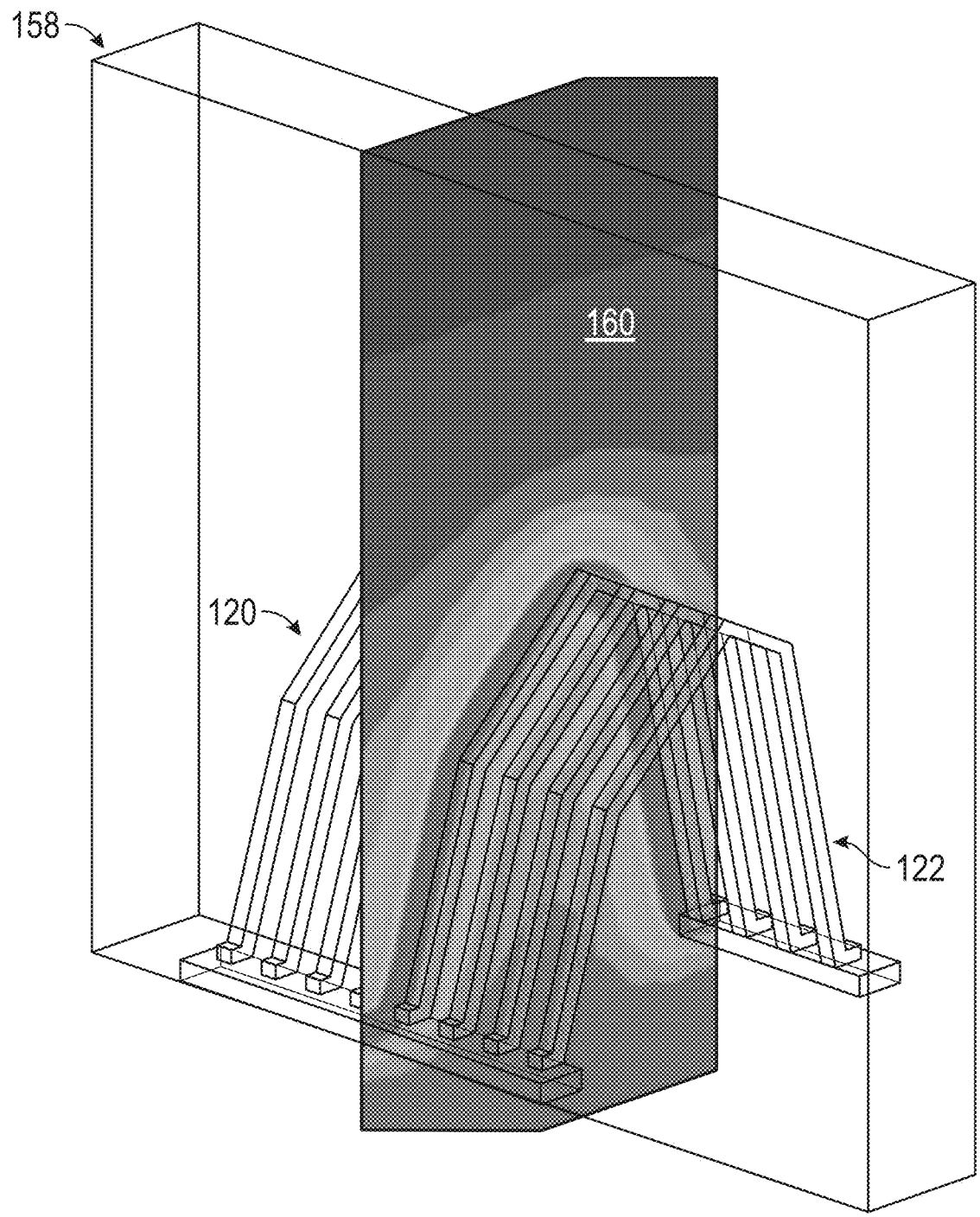
FIG. 8 illustrates a magnetic flux concentration plot modeled in a plane between the adjacent bondwire arrays shown in FIGS. 6-7 and suitable for usage in determining the shape, disposition, and/or thickness distribution of the patterned magnetic shield layer shown in FIG. 6.

When provided as a patterned layer, magnetic shield layer 152 is usefully spatially distributed in those regions in which flux concentration is greatest. The particular pattern in which magnetic shield layer 152 is deposited can be selected to generally mimic or mirror the arch-shaped bondwire profile of bondwires 124, bondwires 132, or both bondwires 124, 132, as viewed along an axis orthogonal to substrate surfaces 151, 152. Stated differently, bondwires 124, 132 may be bent into a curved shape as shown, while magnetic shield layer 152 (and possibly electrical shield layer 154) is patterned to have a planform geometry corresponding to or approximating the curved shape of bondwires 124,132); the term "planform geometry," as appearing herein, referring to the geometry of layer 152 (or layer 154, as the case may be) viewed along an axis orthogonal to substrate surfaces 151, 152. Additionally or alternatively, data may be gathered, whether by computer simulation or utilizing a physical testing apparatus, to plot the flux line concentration in a plane orthogonal to the frontside of substrate 130 and, perhaps, parallel to, if not coplanar with principal surface 150 of substrate layer 148 (FIG. 6). An example of such a computer simulation 158 is shown in FIG. 8, with varying flux line concentrations within a plane 160 indicated by varying colors (represented by varying shading levels in the drawing). Such simulation data 158 can thus be utilized to define the dimensions and shape of patterned magnetic shield layer 152 by judiciously distributing the magnetic shield material in those regions of greatest flux line concentration and, thus, most susceptible to magnetic cross-coupling. Further, if desired, the thickness of magnetic shield layer 152 can be varied in accordance with such mapped flux concentration data; e.g., such that the local thickness of magnetic shield layer 152 is increased in regions of peak flux line concentration, as generally shown in FIG. 6.

In the above-described manner, the provision of EM shield structure 146 can improve magnetic isolation rates during operation of microelectronic assembly 144; e.g., testing data indicates that isolation rates approaching or exceeding 15 dB can be achieved in at least some embodiments of assembly 144. Concurrently, patterning and possible grounding of electrical shield layer 154 can provide performance benefits, such as reduced eddy current losses, as discussed above. EM shield structure 146 can still be fabricated utilizing a batch manufacturing process, if desired; e.g., structure 146 can be produced in parallel with a plurality of like structures by forming patterned layers on opposing sides of a larger panel, which contains dielectric substrate layer 148 and which is subsequently singulated into smaller pieces. In other embodiments, dielectric substrate layer 148 could be replaced with a non-patterned or continuous electric shield layer (with patterned magnetic shield layer 152 formed on one or both sides of the electrical shield layer); or, alternatively, dielectric substrate layer 148 could be replaced with a non-patterned magnetic shield layer (with electrical shield layer 154 formed on one or both sides of the magnetic shield layer).

Although including a patterned magnetic shield layer 152 in the example of FIGS. 6-8, EM shield structure 146 still possess a relatively simple wall-like or fin-like form factor similar to EM shield structure 138 described above in connection with FIGS. 4-5. Further embodiments of the EM shield structure can assume other forms, however, providing that at least a portion of the shield structure is physically positioned between adjacent interconnect features, devices, or other circuit elements included in separate signal paths and is at least partially composed of a magnetically-permeable material. For example, in alternative implementations, EM shield structure can be produced as a wire fence at least partially composed of a magnetically-permeable material, as described below in conjunction with FIGS. 9 and 10.

Figure 9:
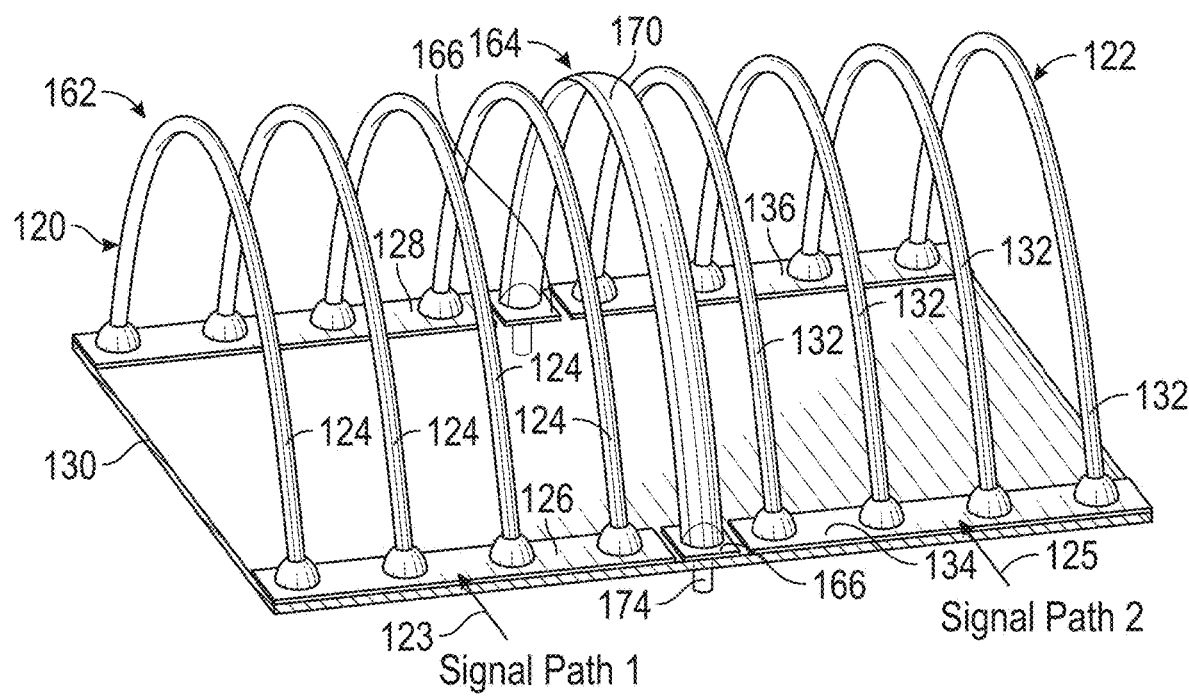
FIG. 9 is an isometric view of adjacent bondwire arrays separated by an intervening EM shield structure in the form of a coated wire fence, as illustrated in accordance with a further exemplary implementation of the present disclosure.
Figure 10:
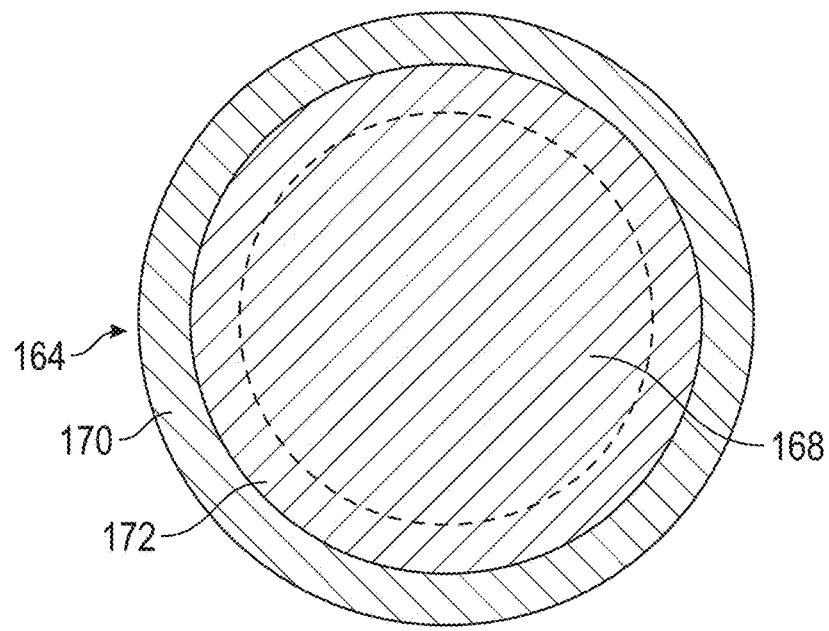
FIG. 10 is a cross-sectional view taken through the coated wire fence shown in FIG. 9 more clearly illustrating an electrically-conductive wire core and magnetically-permeable coating within the wire fence.

Continuing to FIG. 9, an EM-shielded microelectronic assembly 162 is shown in accordance with a further exemplary embodiment of the present disclosure. Once again, like reference numerals utilized in describing FIGS. 4, 6, and 7 have been carried forward to FIG. 9, where appropriate. In this example, EM-shielded microelectronic assembly 162 includes an EM shield structure 164, which is formed as an arch-shaped wire mimicking or following the bond wire profile of bondwires 124, 132. In other words, EM shield structure 164 is imparted with a curved shape, which generally matches, follows, or corresponds to the curved shape of bondwires 124, 132. In certain embodiments, EM shield structure 164 may be wholly composed of a magnetically-permeable material and bonded to bond pads 166. In this case, EM shield structure 164 can be formed utilizing a wirebonding tool, but substituting a wire feed composed of a magnetically-permeable metal or alloy (e.g., a Mu metal) for the electrically-conductive material (e.g., Au, Ag, or Cu) typically utilized in bondwire formation. Alternatively, in such embodiments, EM shield structure 164 may be produced utilizing a three dimensional printing process. In still other embodiments, EM shield structure 164 may contain an electrically-conductive wire core over which a magnetically-permeable coating is applied. This latter possibility is indicated in FIG. 10, which is a cross-section through EM shield structure 164 revealing an electrically-conductive (e.g., Cu, Au, or Ag) wire core 168 surrounded by a magnetically-permeable (e.g., Mu metal) wire coating 170. Additionally, as indicated in phantom in FIG. 10, a cladding 172 may be provided around wire core 168 in embodiments (e.g., a stainless steel- or nickel-clad Cu wire may be utilized), in which case magnetically-permeable wire coating 170 may be adhered to cladding 172.

In embodiments in which EM shield structure 164 contains an electrically-conductive wire core 168 (FIG. 10), wire core 168 may be electrically coupled to ground through bond pads 166 and interconnect features 174 (FIG. 9), such as metal traces, conductive vias, metal plugs, or the like formed in substrate 130. Again, grounding of wire core 168 in this manner may help reduce eddy current losses within EM shield structure 164 during operation of microelectronic assembly 162. Magnetically-permeable wire coating 170 can be applied to wire core 168 before or after bonding to bond pads 166. For example, in embodiments, a wet-state application technique is utilized to apply a precursor material (e.g., a paste or paint) containing magnetically-permeable particles to wire core 168; and then a curing process (e.g., heat treatment) is conducted to convert the precursor material into wire coating 170 by, for example, removing some or all of the organic materials (e.g., a liquid carrier and any organic binders) therefrom. In other embodiments, a different application technique can be utilized; or, as noted above, EM shield structure 164 may be entirely composed of a magnetically-permeable material.

Figure 11:
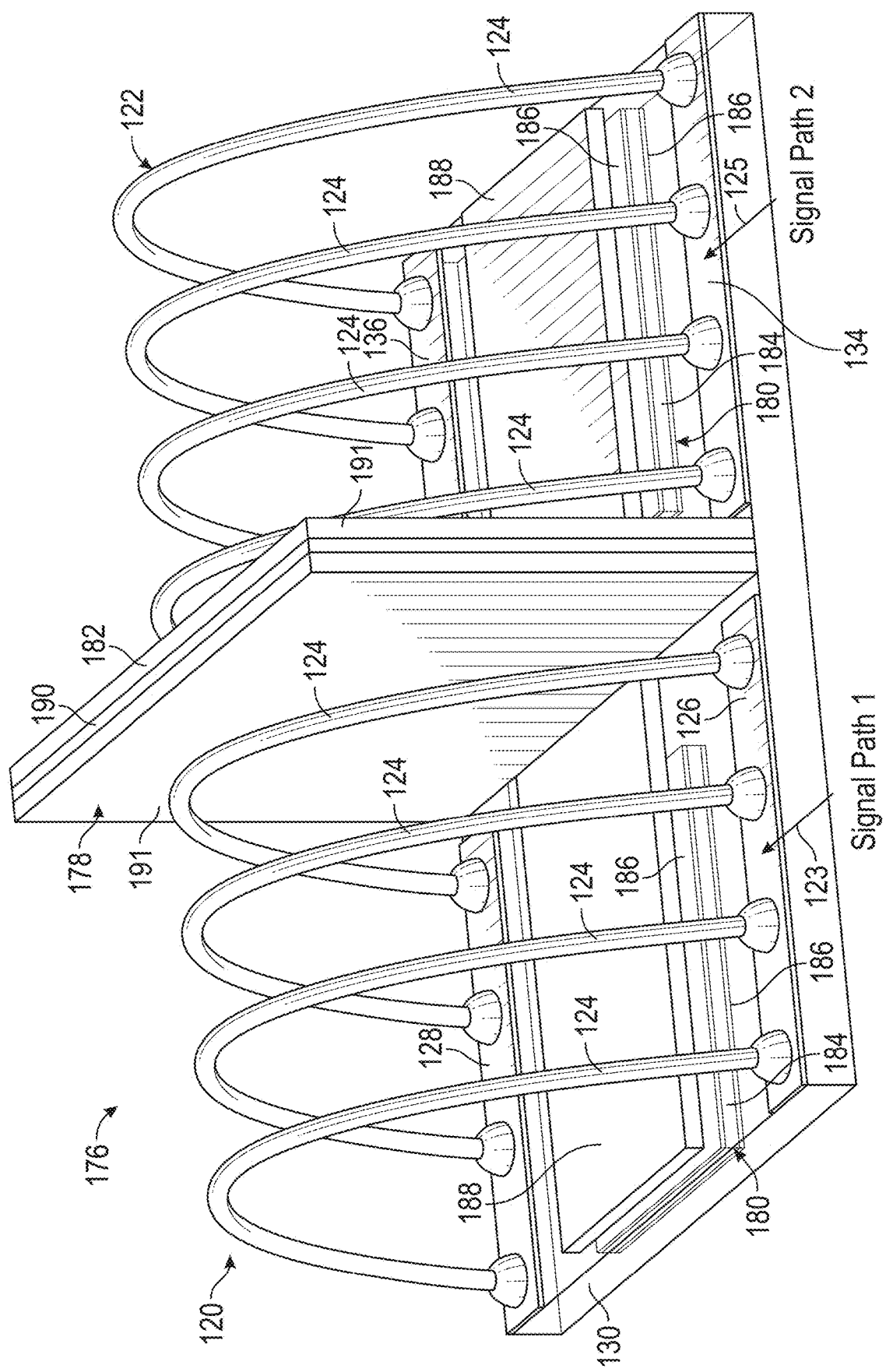
FIG. 11 is an isometric view of adjacent bondwire arrays separated by an intervening EM shield structure, which includes lateral extensions or wings covering microelectronic devices (e.g., integrated capacitors) over which the bondwire arrays extend, as depicted in accordance with a yet further exemplary embodiment.

Advancing next to FIG. 11, there is shown an EM-shielded microelectronic assembly 176 including an EM shield structure 178, as depicted in accordance with a still further exemplary embodiment of the present disclosure. Once again, EM-shielded microelectronic assembly 176 is similar to microelectronic assemblies 118, 144, 162 described above in conjunction with FIGS. 4-10, with reference numerals carried forward where appropriate. However, in contrast to above-described EM-shielded microelectronic assemblies 118, 144, 162, EM-shielded microelectronic assembly 176 further includes two microelectronic devices 180 located on opposing sides of a main body or shield wall 182 of EM shield structure 178, which is oriented to extend substantially orthogonally to the upper principal surface or frontside of substrate 130, as previously described. In this particular example, microelectronic devices 180 are depicted as integrated capacitor structures. Accordingly, microelectronic devices 180 each include a dielectric layer 184 separating two electrically-conductive layers 186, as formed in substrate 130 (shown in phantom to better reveal devices 180) at location beneath shield structure 178 as taken along an axis orthogonal to the frontside of substrate 130. In other embodiments, microelectronic devices 180 can assume other forms, such as chip caps or other passive SMDs mounted to the upper surface of substrate 130.

Microelectronic devices 180 are at least partially nested or positioned between bondwire arrays 120, 122. Stated differently, bondwire arrays 120, 122 extend over devices 180 in a bridge-like fashion. Alternatively, some or all of the bondwires in bondwire arrays 120, 122 may physically and electrically contact top surfaces of microelectronic devices 180 along the length of the bondwires to provide electrical connectivity to microelectronic devices 180 (particularly when the below-described wings 188 are not included in assembly 176). Such arrangements achieve highly dense circuit structures, but again presents an opportunity for undesired EM cross-coupling between devices 180 and bondwire arrays 120, 122 if adequate countermeasures are not provided. Thus, in the example of FIG. 11, EM shield structure 178 is produced to further include two lateral extensions or shield wings 188, which extend in directions opposing principal surfaces of main body 182 of EM shield structure 178 over microelectronic devices 180. Shield wings 188 thus at least partially cover or shroud devices 180, as viewed along an axis orthogonal to the upper surface of substrate 130. Shield wings 188 may or may not be directly bonded to microelectronic devices 180; and, along with main body 182 of EM shield structure 178, wings 188 may be formed of a magnetically-permeable material of a type previously described to reduce magnetic cross-coupling between devices 180 and bondwire arrays 120, 122 during operation of EM-shielded microelectronic assembly 176. In still further embodiments, wings 188 may be replaced by discrete sheets or blocks of material, which are joined (e.g., utilizing epoxy or a die attach material) to the upper surfaces of microelectronic devices 180. As a still further possibility, shield wings 188 may be replaced by deposited layers of a magnetically-permeable material (e.g., a sputter-deposited Mu metal or permalloy) applied directly to the upper surfaces of devices 180 in alternative implementations of EM-shielded microelectronic assembly 176.

Finally, if desired, EM shield structure 178 may be produced to include one or more electrical shield layers 190, which may contact and/or be bonded to one or more magnetic shield layers 191 further included in shield structure 178. For example, as indicated in FIG. 11, an electrical shield layer 190 may be provided as a continuous (non-patterned) layer or body disposed between two magnetic shield layers 191, which face opposing wirebond arrays 124. To this end, in certain implementations, electrical shield layer 190 may be a core layer to which magnetic shield layers 191 are joined as mirror opposites utilizing, for example, an epoxy or other bonding material. As previously indicated, electric shield layer 190 may be composed of a material having a magnetic permeability less than and an electrical conductivity greater than the magnetic permeability and electrical conductivity, respectively, of portions of EM shield structure 178 produced from a magnetically-permeable material (namely, shield layers 191). Further, in at least some implementations, electrical shield layer 190 may be composed of a material having an electrical conductivity at least 50% greater, if not at least twice the electrical conductivity of the material from which magnetic shield layers 191 are composed; while magnetic shield layers 191 may be composed of a material having a magnetic permeability at least 50% greater, if not at least twice the magnetic permeability of the material from which electrical shield layer 190 is composed. When provided, electrical shield layer 190 may be electrically grounded or may be left electrically floating. In alternative implementations, EM shield structure 178 may lack such an electrically-conductive core layer; or be produced to include additional regions or portions formed from an electrically-conductive material, as appropriate to suit a particular application or usage.

Additional Examples of Microelectronic Modules and Systems Containing EM Shield Structures While principally described above in conjunction with exemplary microelectronic packages, such as microelectronic package 62 shown in FIG. 3, it is emphasized that embodiments of the EM shield structures described herein are not so limited. Instead, embodiments of the EM shield structures can be integrated into various different types of microelectronic assemblies prone to EM cross-coupling including, but not limited to, microelectronic modules and systems. As a more specific example, embodiments of the presently-disclosed EM shield structures may be beneficially integrated into modules and systems containing RF circuitry and/or possessing relatively compact form factors to, for example, reduce EM cross-coupling between closely-spaced active devices. To further underscore the versatility of the above-described EM shield structures, a microelectronic assembly 200 in the form of an exemplary massive MIMO transceiver module is further presented in FIG. 12, as seen from a top-down or planform perspective. In this example, microelectronic assembly 200 includes two EM wall-like shield structures 202, 204, which are bonded to an assembly substrate 206 at locations strategically chosen to reduce EM cross-coupling between devices, networks, or modules carrying different electrical signals. In addition to EM shield structures 202, 204 and assembly substrate 206, microelectronic assembly 200 further includes a number of terminals 208 (e.g., female co-axial connectors), an RF PA packaged device 210, and a number of other microelectronic package devices 212, which are electrically interconnected along with other various devices (e.g., SMDs). Package devices 210, 212 are included in transmitter path circuitry (generally outlined by box 214 in FIG. 12) and in receiver path circuitry (outlined by box 216) of assembly 200.

Figure 12:
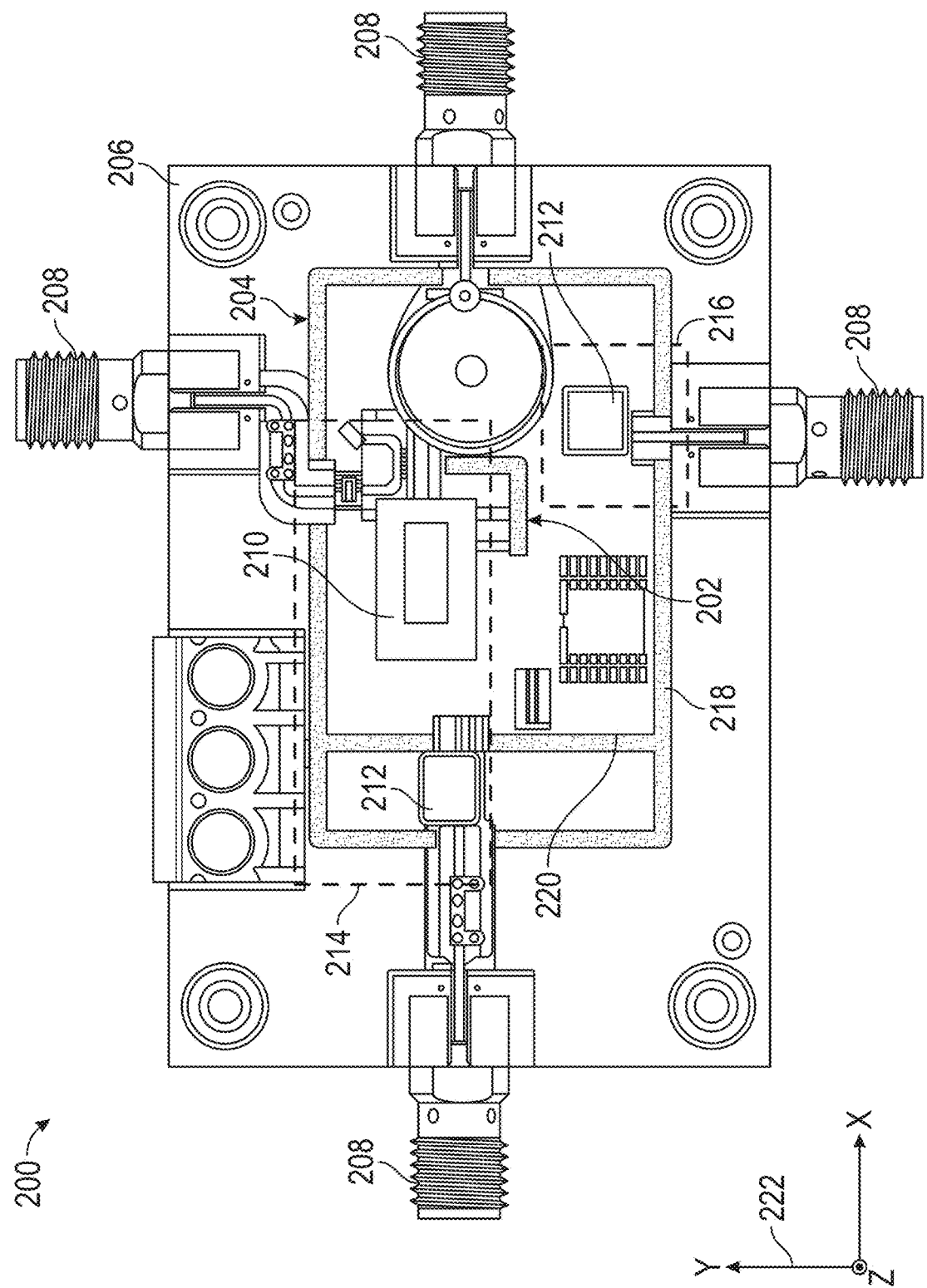
FIG. 12 is a top-down view of a microelectronic assembly and, specifically, a massive MIMO system including multiple EM shield structures, which may have construction similar or identical to that described in any of FIGS. 4, 6, 7, and 11, as illustrated in accordance with another exemplary embodiment of the present disclosure.

EM shield structures can be provided at any number of locations within assembly 200; e.g., one or more EM shield structures may be usefully integrated into RF PA packaged device 210 between different RF sub-networks; e.g., between peaking and carrier amplification paths when device 210 includes a Doherty PA. An EM shield structure 202 can also be provided between receiver path circuitry 214 and transmitter path circuitry 216, as shown in FIG. 12. Shielding can also be provided between analog (RF) and digital networks contained in assembly 200 and/or may further be provided around the outer periphery of circuitry of assembly 200, generally. In this regard, EM shield structure 204 may include an outer peripheral wall or cage portion 218, which extends around the periphery of core circuit elements contained in assembly 200. Peripheral wall 218 may form a closed polygon shape (e.g., a rectangular shape) as viewed from a top-down or planform perspective; that is, along the Z-axis identified by coordinate legend 222. Additionally, EM shield structure 204 may include a dividing wall or internal partition 220, which physically separates portions of the receiver and transmitter networks included in assembly 200. Shield structures 202, 204 can be imparted with any of the constructions described above in conjunction with FIGS. 2-4, 6, 7, and 11, or variations thereof. Accordingly, EM shield structures 202, 204 may each be produced to include an electrical shielding portion or layer bonded to (or otherwise brought in contact or close proximity with) a magnetic shield portion or layer, as previously described and as indicated in FIG. 12 by dot stippling. EM shield structures 202, 204 are usefully imparted with an average or peak height (as measured along the Z-axis of legend 222) equal to or greater than the heights of one or all of packages 210, 112; although the respective heights (and other dimensions) of shield structures 202, 204 may vary in other embodiments. In this manner, the provision of EM shield structures 202, 204 may consequently decrease, if not eliminate EM cross-coupling during operation of assembly 200 to provide the above-described enhancements to assembly performance.

CONCLUSION

There has thus been provided examples of EM-shield microelectronic assemblies, which reduce EM cross-coupling between different signal paths contained in the microelectronic assemblies to enhance performance, even the assembly is operated at higher (e.g., RF) frequencies and/or relatively high power levels and is imparted with a relatively compact form factor. While principally described above in the context of high frequency RF applications, the EM-shielded microelectronic assemblies can be utilized in various different applications in which EM cross-coupling between different signal lines is commonly problematic, whether the signal paths carry digital signals (e.g., as in the case of clock lines), analog signals, or a combination thereof. As further described above, the EM-shielded microelectronic assemblies can be integrated into various different types of microelectronic packages, modules, and assemblies without limitation. As compared to microelectronic assemblies incorporating conventional electrical shield structures, the above-described EM shield structures can achieve significant improvements in isolation rates, which may approach or exceed 20 dB in at least some instances. Embodiments of the above-described invention are consequently well-suited for integration into highly linear and efficient (e.g., LDMOS, GaN, or other) RF power amplifiers. Additionally, embodiments of the disclosure are well-suited for usage in integrated products, such as RF amplifier and/or transceiver modules, due to proximity of active devices in such products. It still further embodiments, the EM-shielded microelectronic assemblies can be incorporated into various other types of microelectronic devices in which enhanced EM shielding is desired.

In embodiments, the above-described EM-shielded microelectronic assembly (e.g., a package, module, or system) includes first and second signal paths, which carry different or distinct electrical signals during operation of the microelectronic assembly. An EM shield structure is positioned between the first and second signal paths. The EM shield structure includes, in turn, a magnetic shield portion adjacent (e.g., in contact with and/or directly or indirectly bonded to and/or without other intervening structures) an electrical shield portion. The magnetic shield portion has a first magnetic permeability and a first electrical conductivity, while the electrical shield portion has a second magnetic permeability less than the first magnetic permeability and having a second electrical conductivity greater than the first electrical conductivity. Further, in certain embodiments, the first magnetic permeability (the magnetic permeability of the magnetic shield portion or layer) may be at least 10% greater, preferably at least 50% greater, and still more preferably at least twice the second magnetic permeability. Additionally or alternatively, the second electrical conductivity (the electrical conductivity of the electrical shield portion or layer) may be at least 10% greater, preferably at least 50% greater, and still more preferably at least twice the first electrical conductivity. In this manner, the EM shield structure decreases EM cross-coupling between the first and second signal paths during operating of the EM-shielded microelectronic assembly.

In further embodiments, the EM-shielded microelectronic assembly includes first and second signal paths, which carry different electrical signals during operation of the electromagnetically-shielded microelectronic assembly. The microelectronic assembly further includes a first interconnect feature (e.g., a first metal trace or bondwire) through which the first signal path extends, a second interconnect feature (e.g., a second metal trace or bondwire) through which the second signal path extends, and a substrate having a frontside to which the first and second interconnect features are coupled, such as by bonding to a bond pad present on the frontside of the substrate or through a microelectronic device (e.g., a semiconductor die) mounted to the frontside. An EM shield structure contains: (i) a shield substrate projecting from the frontside of the substrate at a location between the first and second interconnect features; and (ii) a patterned magnetic shield layer in contact with (e.g., directly bonded to) a first principal surface of the shield substrate. The patterned magnetic shield layer is composed of a magnetically-permeable material decreasing EM cross-coupling between the first and second signal paths during operation of the electromagnetically-shielded microelectronic assembly. In certain embodiments, the electromagnetically-shielded microelectronic assembly may further include RF PA circuitry, in which case the first and second signal paths may assume the form of first and second (e.g., peaking and carrier) amplifier paths, respectively, included in RF PA circuitry.

In certain instances, the EM-shielded microelectronic assembly described in the foregoing paragraph may contain a patterned electrical shield layer, which is in contact with (e.g., bonded to) a second opposing principal surface of the shield substrate opposite the patterned magnetic shield layer. In such instances, the shield substrate may be composed of a dielectric material, while the patterned electrical shield layer is electrically grounded; e.g., an electrical conductor, such as a trace, may connect to the electrical shield layer to couple the shield layer to ground. In other instances, the magnetically-permeable material may have a first magnetic permeability and a first electrical conductivity, while the shield substrate is composed of a material having a second magnetic permeability less than the first magnetic permeability and a second electrical conductivity greater than the first electrical conductivity. In still other instances, the first interconnect feature may assume the form of a bondwire having an arched or curved bondwire profile, while the patterned magnetic shield layer is patterned to have an arched planform geometry generally corresponding to or mimicking the arched bondwire profile.

In yet further embodiments, the EM-shielded microelectronic assembly includes first and second signal paths; a first bondwire through which the first signal path extends, a second bondwire through which the second signal path extends, and an EM shield structure positioned between the first and second bondwires. The EM shield structure at least partially composed of a magnetically-permeable material decreasing magnetic cross-coupling between the first and second bondwires during operation of the electromagnetically-shielded microelectronic assembly. The magnetically-permeable material may be present as, for example, a continuous layer, a patterned layer, or a magnetically-permeable coating. As a more specific example, in certain implementations, the EM shield structure may include an electrically-conductive wire core and a magnetically-permeable coating formed around the wire core.

Embodiments of methods for fabricating EM-shielded microelectronic assemblies and EM shield structures have also been provided. For example, in embodiments, method may include the step or process of providing a microelectronic assembly including first and second signal paths, which carry different electrical signals during operation of the microelectronic assembly. An EM structure may be disposed between the first and second signal paths. In certain implementations, the EM structure may be formed to include: (i) a magnetic shield portion having a first magnetic permeability and a first electrical conductivity; and (ii) an electrical shield portion joined to the magnetic shield portion, the electrical shield portion having a second magnetic permeability less than the first magnetic permeability and having a second electrical conductivity greater than the first electrical conductivity. In other embodiments, the EM structure may include a shield substrate to which a patterned magnetic shield layer is bonded. The patterned magnetic shield layer may potentially be imparted with a curved or arch-shaped planform geometry, which may generally follow or correspond with the shape of a bondwire adjacent the EM structure and through which the first signal path extends. Additionally or alternatively, the method may include the step of mapping magnetic flux concentrations occurring duration operation of the microelectronic assembly (e.g., via a computer simulation such as that shown in FIG. 8) at the location of the patterned magnetic shield layer and imparting the patterned magnetic shield layer to have an increased thickness in regions of higher magnetic flux concentration. Finally, as a further possibility, the EM structure may be produced to include a patterned electrical shield layer bonded to the shield substrate opposite the patterned magnetic shield layer in certain instances.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary

What is claimed is:

1. An electromagnetically-shielded microelectronic assembly, comprising:
   first and second signal paths, which carry different electrical signals during operation of the microelectronic assembly; and
   an electromagnetic (EM) shield structure positioned between the first and second signal paths, the EM shield structure comprising:
   a magnetic shield portion having a first magnetic permeability and a first electrical conductivity; and
   an electrical shield portion adjacent the magnetic shield portion, the electrical shield portion having a second magnetic permeability less than the first magnetic permeability and having a second electrical conductivity greater than the first electrical conductivity.

2. The electromagnetically-shielded microelectronic assembly of claim 1 further comprising an assembly substrate having a frontside from which the EM shield structure projects.

3. The electromagnetically-shielded microelectronic assembly of claim 2 further comprising:
   a first interconnect feature through which the first signal path extends, bonded to the substrate, and located on a first side of the EM shield structure; and
   a second interconnect feature through which the second signal path extends, bonded to the substrate, and located on a second, opposing side of the EM shield structure.

4. The electromagnetically-shielded microelectronic assembly of claim 3 wherein the first interconnect feature has a first peak height as taken along a first axis orthogonal to the frontside, and wherein the EM shield structure has a second peak height equal to or greater than the first peak height as taken along a second axis orthogonal to the frontside.

5. The electromagnetically-shielded microelectronic assembly of claim 1 wherein the EM shield structure further comprises a dielectric substrate layer having a first principal surface and a second principal surface opposite the first principal surface; and
   wherein the magnetic shield portion comprises a magnetic shield layer in contact with the first principal surface.

6. The electromagnetically-shielded microelectronic assembly of claim 5 wherein the electrical shield layer comprises an electrical shield layer in contact with the second principal surface of the dielectric substrate layer.

7. The electromagnetically-shielded microelectronic assembly of claim 6 wherein the first interconnect feature comprises a bondwire bent into a curved shape, and wherein at least one of the magnetic shield layer and the electrical shield layer is patterned to have a planform geometry corresponding to the curved shape of the bondwire.

8. The electromagnetically-shielded microelectronic assembly of claim 1 further comprising a ground conductor connected to the electrical shield portion and coupling the electrical shield portion to electrical ground.

9. The electromagnetically-shielded microelectronic assembly of claim 1 wherein the magnetic shield portion comprises a coating composed of a magnetically-permeable material and formed over an outer surface of the electrical shield portion.

10. The electromagnetically-shielded microelectronic assembly of claim 9 wherein the electrical shield portion comprises an electrically-conductive wire core.

11. The electromagnetically-shielded microelectronic assembly of claim 1 further comprising:
    a substrate having a frontside;
    a first bondwire coupled to the frontside and through which the first signal path extends; and
    a microelectronic device over which the first bondwire extends, the microelectronic device at least partially covered by the EM shield structure as taken along an axis orthogonal to the frontside.

12. The electromagnetically-shielded microelectronic assembly of claim 11 further comprising a second bondwire coupled to the frontside and through which the second signal path extends;
    wherein the EM shield structure further comprises:
    a main body positioned between the first and second bondwires; and
    a shield wing projecting from the main body over at least a portion of the microelectronic device.

13. The electromagnetically-shielded microelectronic assembly of claim 1 further comprising radio frequency power amplification circuitry;
    wherein the first and second signal paths comprise first and second amplifier paths, respectively, included in radio frequency power amplification circuitry.

14. An electromagnetically-shielded microelectronic assembly, comprising:
    first and second signal paths, which carry different electrical signals during operation of the electromagnetically-shielded microelectronic assembly;
    a first interconnect feature through which the first signal path extends;
    a second interconnect feature through which the second signal path extends;
    a substrate having a frontside to which the first and second interconnect features are coupled; and
    an electromagnetic (EM) shield structure, comprising:
    a shield substrate projecting from the frontside of the substrate at a location between the first and second interconnect features; and
    a patterned magnetic shield layer in contact with a first principal surface of the shield substrate and composed of a magnetically-permeable material configured to decrease EM cross-coupling between the first and second signal paths during operation of the electromagnetically-shielded microelectronic assembly.

15. The electromagnetically-shielded microelectronic assembly of claim 14 wherein the EM shield structure further comprises a patterned electrical shield layer bonded to a second opposing principal surface of the shield substrate opposite the patterned magnetic shield layer.

16. The electromagnetically-shielded microelectronic assembly of claim 15 wherein the shield substrate is composed of a dielectric material, and wherein the patterned electrical shield layer is electrically grounded.

17. The electromagnetically-shielded microelectronic assembly of claim 14 wherein the magnetically-permeable material has a first magnetic permeability and a first electrical conductivity, and wherein the shield substrate is composed of a material having a second magnetic permeability less than the first magnetic permeability and a second electrical conductivity greater than the first electrical conductivity.

18. The electromagnetically-shielded microelectronic assembly of claim 14 wherein the first interconnect feature comprises a bondwire having an arched bondwire profile, and wherein the patterned magnetic shield layer is patterned to have an arched planform geometry generally corresponding to the arched bondwire profile.

19. An electromagnetically-shielded microelectronic assembly, comprising:

first and second signal paths, which carry different electrical signals during operation of the electromagnetically-shielded microelectronic assembly;

a first bondwire through which the first signal path extends;

a second bondwire through which the second signal path extends; and an electromagnetic (EM) shield structure between the first and second bondwires, the EM shield structure at least partially composed of a magnetically-permeable material configured to decrease magnetic cross-coupling between the first and second bondwires during operation of the electromagnetically-shielded microelectronic assembly.

20. The electromagnetically-shielded microelectronic assembly of claim 19 wherein the EM shield structure comprises:

an electrically-conductive wire core; and a magnetically-permeable coating formed around the wire core.

* * * * *